US009743215B2

(12) United States Patent
Uhle et al.

(10) Patent No.: US 9,743,215 B2
(45) Date of Patent: Aug. 22, 2017

(54) APPARATUS AND METHOD FOR CENTER SIGNAL SCALING AND STEREOPHONIC ENHANCEMENT BASED ON A SIGNAL-TO-DOWNMIX RATIO

(71) Applicant: Fraunhofer-Gesellschaft zur Foerderung der angewandten Forschung e.V., Munich (DE)

(72) Inventors: Christian Uhle, Ursensolien (DE); Peter Prokein, Erlangen (DE); Oliver Hellmuth, Erlangen (DE); Sebastian Scharrer, Hersbruck (DE); Emanuel Habets, Spardorf (DE)

(73) Assignee: Fraunhofer-Gesellschaft zur Foerderung der angewandten Forschung e.V., München (DE)

( * ) Notice: Subject to any disclaimer, the term of this patent is extended or adjusted under 35 U.S.C. 154(b) by 0 days.

(21) Appl. No.: 14/880,065

(22) Filed: Oct. 9, 2015

(65) Prior Publication Data

US 2016/0037283 A1 Feb. 4, 2016

Related U.S. Application Data

(63) Continuation of application No. PCT/EP2014/056917, filed on Apr. 7, 2014.

(30) Foreign Application Priority Data

Apr. 12, 2013 (EP) .................................... 13163621
Aug. 28, 2013 (EP) .................................... 13182103

(51) Int. Cl.
*H04R 5/00* (2006.01)
*H03G 3/00* (2006.01)
(Continued)

(52) U.S. Cl.
CPC ................ *H04S 7/307* (2013.01); *H04S 3/02* (2013.01); *H04S 3/00* (2013.01); *H04S 2400/01* (2013.01);
(Continued)

(58) Field of Classification Search
CPC ... H04S 7/307; H04S 3/02; H04S 3/00; H04S 2400/01; H04S 2400/03; H04S 2400/05
(Continued)

(56) References Cited

U.S. PATENT DOCUMENTS

2010/0079187 A1 4/2010 Lee et al.
2010/0296672 A1 11/2010 Vickers

FOREIGN PATENT DOCUMENTS

CN 102165520 A 8/2011
EP 2464145 A1 6/2012
WO 2014166863 A1 10/2014

OTHER PUBLICATIONS

Allen et al.; "Multimicrophone signal-processing technique to remove room reverberation from speech signals," J. Acoust. Soc. Am., Oct. 1977; 62:4(912-915).

(Continued)

*Primary Examiner* — Xu Mei
*Assistant Examiner* — Douglas Suthers
(74) *Attorney, Agent, or Firm* — Haynes and Boone, LLP

(57) ABSTRACT

An apparatus for generating a modified audio signal having two or more modified audio channels from an audio input signal comprising two or more audio input channels is provided. The apparatus has an information generator for generating signal-to-downmix information. The information generator is adapted to generate signal information by combining a spectral value of each of the two or more audio input channels in a first way. The information generator is adapted to generate downmix information by combining the (Continued)

spectral value of each of the two or more audio input channels in a second way being different from the first way. Furthermore, the information generator is adapted to combine the signal information and the downmix information to obtain signal-to-downmix information. The apparatus has a signal attenuator for attenuating the two or more audio input channels depending on the signal-to-downmix information to obtain the two or more modified audio channels.

14 Claims, 15 Drawing Sheets

(51) Int. Cl.
*H04S 7/00* (2006.01)
*H04S 3/02* (2006.01)
*H04S 3/00* (2006.01)

(52) U.S. Cl.
CPC ....... *H04S 2400/03* (2013.01); *H04S 2400/05* (2013.01)

(58) Field of Classification Search
USPC .................................................... 381/27, 107
See application file for complete search history.

(56) References Cited

OTHER PUBLICATIONS

Arberet et al.; "A Robust Method to Count and Locate Audio Sources in a Stereophonic Linear Anechoic Mixture," IEEE/ICASSP, 2007; III(745-748).
Avendano et al.; "A Frequency-Domain Approach to Multichannel Upmix," AES 22nd International Conference on Virtual, Synthetic and Entertainment Audio, 2002; Espoo, Finland.
Bach et al.; "Robust speech detection in real acoustic backgrounds with perceptually motivated features," Speech Communication, 2011; 53(690-706).
Barry et al.; "Sound Source Separation: Azimuth Discrimination and Resynthesis," Proc. of the 7th Int. Conference on Digital Audio Effects, Oct. 5-8, 2004; pp. DAFX-1-DAFX-5; Naples, Italy.
Berg et al.; Identification of Quality Attributes of Spatial Audio by Repertory Grid Technique, J. Audio Eng. Soc., 2006; 54(365-379).
Blauert, Jens; "Spatial Hearing," MIT Press, 1996; pp. i, vi, 3-4, and 37-38.
Cahill et al.; "Speech Source Enhancement using a Modified ADRess Algorithm for Applications in Mobile Communications," AES 121st Convention, Oct. 5-8, 2006; pp. 1-10; San Francisco, California, USA.
EPO Search Report in related EP Patent Application No. 13182103 dated Jul. 2, 2014.
Faller, Christof; "Multiple-Loudspeaker Playback of Stereo Signals," J. Audio Eng. Soc., Nov. 2006; 54:11 :(1051-1064).
Favrot et al.; "Improved Cocktail-Party Processing," Proc. of the 9th Int. Conference on Digital Audio Effects, Sep. 18-20, 2006; pp. DAFX-227-DAFX-232; Montreal, Canada.
Fuchs et al.; "Dialogue Enhancement—technology and experiments," EBU Technical Review, 2012; Q2(1-11).
International Telecommunication Union; "Multichannel stereophonic sound system with and without accompanying picture," Recommendation ITU-R BS.775-3, BS Series [Broadcasting service (sound)], Aug. 2012; Geneva, Switzerland.
International Telecommunication Union; "Algorithms to measure audio programme loudness and truepeak audio level," Draft Revision to Recommendation ITU-R BS.1770-1, Nov. 2010.
International Telecommunication Union; "Algorithms to measure audio programme loudness and true-peak audio level," Recommendation ITU-R BS.1770-2, BS Series [Broadcasting service (sound)], Mar. 2011; Geneva, Switzerland.
Jang et al.; "Center Channel Separation Based on Spatial Analysis," Proc. of the 11th Int. Conference on Digital Audio Effects, Sep. 1-4, 2008; pp. DAFX-1-DAFX-4; Espoo, Finland.
Jourjine et al.; "Blind Separation of Disjoint Orthogonal Signals: Demixing N Sources From 2 Mixtures," Proc. IEEE International Conference on Acoustics, Speech, and Signal Processing (ICASSP) 2000; pp. 1-4.
Mandel et al.; "Model-Based Expectation-Maximization Source Separation and Localization," IEEE Transactions on Audio, Speech, and Language Processing, Feb. 2010; 18:2(382-394).
Merimaa et al.; "Correlation-Based Ambience Extraction from Stereo Recordings," 123rd Convention of Audio Engineering Society, Oct. 5-8, 2007; pp. 1-15; New York, New York.
Puigt et al.; "A Time-Frequency Correlation-Based Blind Source Separation Method for Time-Delayed Mixtures," Proc. IEEE International Conference on Acoustics, Speech, and Signal Processing (ICASSP) 2006; pp. V853-V856.
Rickard, Scott; "The DUET Blind Source Separation Algorithm," Blind Speech Separation, 2007; pp. 217-241; S. Makino et al. editors; Springer Publishing.
Uhle et al.; "Ambience Separation from Mono Recordings using Non-negative Matrix Factorization," 30th International conference of Audio Engineering Society, Mar. 15-17, 2007; pp. 1-8; Saariselka, Finland.
Uhle et al.; "A Supervised Learning Approach to Ambience Extraction From Mono Recordings for Blind Upmixing," Proc. of the 11th Int. Conference on Digital Audio Effects, Sep. 1-4, 2008; pp. DAFX-1-DAFX-8; Espoo, Finland.
Usher et al.; "Enhancement of Spatial Sound Quality: A New Reverberation-Extraction Audio Upmixer," IEEE Transactions on Audio, Speech, and Language Processing, Sep. 2007; 15:7(2141-2150).
Vickers, Earl; "Frequency-Domain Two-to Three-Channel Upmix for Center Channel Derivation and Speech Enhancement," 127th Convention of Audio Engineering Society, Oct. 9-12, 2009; pp. 1-24; New York, New York.
Viste et al.; "On the Use of Spatial Cues to Improve Binaural Source Separation," Proc. of the 6th Int. Conference on Digital Audio Effects, Sep. 8-11, 2003; pp. DAFX-1-DAFX-5; London, United Kingdom.
Yilmaz et al.; "Blind Separation of Speech Mixtures via Time-Frequency Masking," IEEE Transactions on Signal Processing, Jul. 2004; 52:7(1830-1847).
Office Action dated Sep. 7, 2016 issued in the parallel Chinese patent application No. 2014800333135 (13 pages with English translation).

APPARATUS AND METHOD FOR CENTER SIGNAL SCALING AND STEREOPHONIC ENHANCEMENT BASED ON A SIGNAL-TO-DOWNMIX RATIO

CROSS-REFERENCE TO RELATED APPLICATIONS

This application is a continuation of copending International Application No. PCT/EP2014/056917, filed Apr. 7, 2014, which is incorporated herein by reference in its entirety, and additionally claims priority from European Application No. 13163621.9, filed Apr. 12, 2013, and from European Application No. 13182103.5, filed Aug. 28, 2013, which are also incorporated herein by reference in their entirety.

BACKGROUND OF THE INVENTION

The present invention relates to audio signal processing and, in particular, to a center signal scaling and stereophonic enhancement based on the signal-to-downmix ratio.

Audio signals are in general a mixture of direct sounds and ambient (or diffuse) sounds. Direct signals are emitted by sound sources, e.g., a musical instrument, a vocalist, or a loudspeaker, and arrive on the shortest possible path at the receiver, e.g., the listener's ear or a microphone. When listening to a direct sound, it is perceived as coming from the direction of the sound source. The relevant auditory cues for the localization and for other spatial sound properties are interaural level difference (ILD), interaural time difference (ITD), and interaural coherence. Direct sound waves evoking identical ILD and ITD are perceived as coming from the same direction. In the absence of ambient sound, the signals reaching the left and the right ear or any other set of spaced sensors are coherent.

Ambient sounds, in contrast, are emitted by many spaced sound sources or sound reflecting boundaries contributing to the same sound. When a sound wave reaches a wall in a room, a portion of it is reflected, and the superposition of all reflections in a room, the reverberation, is a prominent example for ambient sounds. Other examples are applause, babble noise, and wind noise. Ambient sounds are perceived as being diffuse, not locatable, and evoke an impression of envelopment (of being "immersed in sound") by the listener. When capturing an ambient sound field using a set of spaced sensors, the recorded signals are at least partially incoherent.

Related known technology on separation, decomposition, or scaling is either based on panning information, i.e., inter-channel level differences (ICLD) and inter-channel time differences (ICTD), or based on signal characteristics of direct and of ambient sounds. Methods taking advantage of ICLD in two-channel stereophonic recordings are the upmix method described in C. Avendano and J.-M. Jot, "A frequency-domain approach to multi-channel upmix," *J. Audio Eng. Soc.*, vol. 52, 2004; the Azimuth Discrimination and Resynthesis (ADRess) algorithm described in D. Barry, B. Lawlor, and E. Coyle, "Sound source separation: Azimuth discrimination and resynthesis," in *Proc. Int. Conf. Digital Audio Effects* (*DAFx*), 2004; the upmix from two-channel input signals to three channels proposed by E. Vickers in "Two-to-three channel upmix for center channel derivation and speech enhancement," in *Proc. Audio Eng. Soc.* 127*th Conv.,* 2009; and the center signal extraction described in D. Jang, J. Hong, H. Jung, and K. Kang, "Center channel separation based on spatial analysis," in *Proc. Int. Conf. Digital Audio Effects* (*DAFx*), 2008.

The Degenerate Unmixing Estimation Technique (DUET) described in A. Jourjine, S. Rickard, and O. Yilmaz, "Blind separation of disjoint orthogonal signals: Demixing N sources from 2 mixtures," in *Proc. Int. Conf. Acoust., Speech, Signal Process*. (ICASSP), 2000; and O. Yilmaz and S. Rickard, "Blind separation of speech mixtures via time-frequency masking," *IEEE Trans. on Signal Proc.*, vol. 52, pp. 1830-1847, 2004, is based on clustering the time-frequency bins into sets with similar ICLD and ICTD. A restriction of the original method is that the maximum frequency which can be processed equals half the speed of sound over maximum microphone spacing (due to ambiguities in the ICTD estimation) which has been addressed in S. Rickard, "The DUET blind source separation algorithm," in *Blind Speech Separation*, S: Makino, T.-W. Lee, and H. Sawada, Eds. Springer, 2007. The performance of the method decreases when sources overlap in the time-frequency domain and when the reverberation increases. Other methods based on ICLD and ICTD are the Modified ADRess algorithm described in N. Cahill, R. Cooney, K. Humphreys, and R. Lawlor, "Speech source enhancement using a modified ADRess algorithm for applications in mobile communications," in *Proc. Audio Eng. Soc.* 121*st Conv.,* 2006, which extends ADRess algorithm described in D. Barry, B. Lawlor, and E. Coyle, "Sound source separation: Azimuth discrimination and resynthesis," in *Proc. Int. Conf. Digital Audio Effects* (*DAFx*), 2004, for the processing of spaced microphone recordings, the method based on time-frequency correlation (AD-TIFCORR) described in M. Puigt and Y. Deville, "A time-frequency correlation-based blind source separation method for time-delay mixtures," in *Proc. Int. Conf. Acoust., Speech, Signal Process*. (ICASSP), 2006, for time-delayed mixtures, the Direction Estimation of Mixing Matrix (DEMIX) for anechoic mixtures described in Simon Arberet, Remi Gribonval, and Frederic Bimbot, "A robust method to count and locate audio sources in a stereophonic linear anechoic mixture," in *Proc. Int. Conf. Acoust., Speech, Signal Process*. (ICASSP), 2007, which includes a confidence measure that only one source is active at a particular time-frequency bin, the Model-based Expectation-Maximization Source Separation and Localization (MESSL) described in M. I. Mandel, R. J. Weiss, and D. P. W. Ellis, "Model-based expectation-maximization source separation and localization," *IEEE Trans. on Audio, Speech and Language Proc.*, vol. 18, pp. 382-394, 2010, and methods mimicking the binaural human hearing mechanism as in, e.g., H. Viste and G. Evangelista, "On the use of spatial cues to improve binaural source separation," in *Proc. Int. Conf. Digital Audio Effects* (*DAFx*), 2003; and A. Favrot, M. Erne, and C. Faller, "Improved cocktail-party processing," in *Proc. Int. Conf. Digital Audio Effects* (*DAFx*), 2006.

Despite the methods for Blind Source Separation (BSS) using spatial cues of direct signal components mentioned above, also the extraction and attenuation of ambient signals are related to the presented method. Methods based on the inter-channel coherence (ICC) in two-channel signals are described in J. B. Allen, D. A. Berkeley, and J. Blauert, "Multimicrophone signal-processing technique to remove room reverberation from speech signals," *J. Acoust. Soc. Am.*, vol. 62, 1977; C. Avendano and J.-M. Jot, "A frequency-domain approach to multi-channel upmix," *J. Audio Eng. Soc.*, vol. 52, 2004; and Merimaa, M. Goodwin, and J.-M. Jot, "Correlation-based ambience extraction from stereo recordings," in *Proc. Audio Eng. Soc.* 123*rd Conv.,* 2007. The application of adaptive filtering has been proposed in J. Usher and J. Benesty, "Enhancement of spatial sound quality: A new reverberation-extraction audio upmixer," *IEEE Trans. on Audio, Speech, and Language Processing*, vol. 15, pp. 2141-2150, 2007, with the rationale that direct signals can be predicted across channels, whereas diffuse sounds are obtained from the prediction error.

A method for upmixing of two-channel stereophonic signals based on multichannel Wiener filtering estimates both the ICLD of direct sounds and the power spectral densities (PSD) of the direct and ambient signal components described in C. Faller, "Multiple-loudspeaker playback of stereo signals," *J. Audio Eng. Soc.*, vol. 54, 2006.

Approaches to the extraction of ambient signals from single channel recordings include the use of Non-Negative Matrix Factorization of a time-frequency representation of the input signal, where the ambient signal is obtained from the residual of that approximation as described in C. Uhle, A. Walther, O. Hellmuth, and J. Herre, "Ambience separation from mono recordings using Non-negative Matrix Factorization," in *Proc. Audio Eng. Soc. 30th Int. Conf.*, 2007; low-level feature extraction and supervised learning as described in C. Uhle and C. Paul, "A supervised learning approach to ambience extraction from mono recordings for blind upmixing," in *Proc. Int. Conf. Digital Audio Effects (DAFx)*, 2008; and the estimation of the impulse response of a reverberant system and inverse filtering in the frequency domain as described in G. Soulodre, "System for extracting and changing the reverberant content of an audio input signal," U.S. Pat. No. 8,036,767, October 2011.

SUMMARY

According to an embodiment, an apparatus for generating a modified audio signal having two or more modified audio channels from an audio input signal having two or more audio input channels may have an information generator for generating signal-to-downmix information, wherein the information generator is adapted to generate signal information by combining a spectral value of each of the two or more audio input channels in a first way, wherein the information generator is adapted to generate downmix information by combining the spectral value of each of the two or more audio input channels in a second way being different from the first way, and wherein the information generator is adapted to combine the signal information and the downmix information to obtain signal-to-downmix information, and a signal attenuator for attenuating the two or more audio input channels depending on the signal-to-downmix information to obtain the two or more modified audio channels, wherein the information generator is configured to generate the signal information $\Phi_1(m, k)$ according to the formula:

$$\Phi_1(m,k)=\epsilon\{WX(m,k)(WX(m,k))^H\},$$

wherein the information generator is configured to generate the downmix information $\Phi_2(m, k)$ according to the formula:

$$\Phi_2(m,k)=\epsilon\{VX(m,k)(VX(m,k))^H\}, \text{ and}$$

wherein the information generator is configured to generate a signal-to-downmix ratio as the signal-to-downmix information $R_g(m, k, \beta)$ according to the formula:

$$R_g(m,k,\beta)=\left(\frac{tr\{\Phi_1(m,k)^\beta\}}{tr\{\Phi_2(m,k)^\beta\}}\right)^{\frac{1}{2\beta-1}}$$

wherein X(m, k) indicates the audio input signal, wherein $$X(m,k)=[X_1(m,k)\ \ldots\ X_N(m,k)]^T,$$

wherein N indicates the number of audio input channels of the audio input signal, wherein m indicates a time index, and wherein k indicates a frequency index, wherein $X_1(m, k)$ indicates the first audio input channel, wherein $X_N(m, k)$ indicates the N-th audio input channel, wherein V indicates a matrix or a vector, wherein W indicates a matrix or a vector, wherein H indicates the conjugate transpose of a matrix or a vector, wherein $\epsilon\{\bullet\}$ is an expectation operation, wherein β is a real number with β>0, and wherein tr{ } is the trace of a matrix.

According to another embodiment, a system may have: a phase compensator for generating a phase-compensated audio signal having two or more phase-compensated audio channels from an unprocessed audio signal having two or more unprocessed audio channels, and an apparatus as described above for receiving the phase compensated audio signal as an audio input signal and for generating a modified audio signal having two or more modified audio channels from the audio input signal having the two or more phase-compensated audio channels as two or more audio input channels, wherein one of the two or more unprocessed audio channels is a reference channel, wherein the phase compensator is adapted to estimate for each unprocessed audio channel of the two or more unprocessed audio channels which is not the reference channel a phase transfer function between said unprocessed audio channel and the reference channel, and wherein the phase compensator is adapted to generate the phase-compensated audio signal by modifying each unprocessed audio channel of the unprocessed audio channels which is not the reference channel depending on the phase transfer function of said unprocessed audio channel.

According to another embodiment, a method for generating a modified audio signal having two or more modified audio channels from an audio input signal having two or more audio input channels may have the steps of: generating signal information by combining a spectral value of each of the two or more audio input channels in a first way, generating downmix information by combining the spectral value of each of the two or more audio input channels in a second way being different from the first way, generating signal-to-downmix information by combining the signal information and the downmix information, and attenuating the two or more audio input channels depending on the signal-to-downmix information to obtain the two or more modified audio channels, wherein generating the signal information $\Phi_1(m, k)$ is conducted according to the formula:

$$\Phi_1(m,k)=\epsilon\{WX(m,k)(WX(m,k))^H\},$$

wherein generating the downmix information $\Phi_2(m, k)$ is conducted according to the formula:

$$\Phi_2(m,k)=\epsilon\{VX(m,k)(VX(m,k))^H\}, \text{ and}$$

wherein a signal-to-downmix ratio is generated as the signal-to-downmix information $R_g(m, k, \beta)$ according to the formula:

$$R_g(m,k,\beta)=\left(\frac{tr\{\Phi_1(m,k)^\beta\}}{tr\{\Phi_2(m,k)^\beta\}}\right)^{\frac{1}{2\beta-1}}$$

wherein X(m, k) indicates the audio input signal, wherein $$X(m,k)=[X_1(m,k)\ \ldots\ X_N(m,k)]^T,$$

wherein N indicates the number of audio input channels of the audio input signal, wherein indicates a time index, and wherein k indicates a frequency index, wherein $X_1(m, k)$ indicates the first audio input channel, wherein $X_N(m, k)$ indicates the N-th audio input channel, wherein V indicates a matrix or a vector, wherein W indicates a matrix or a vector, wherein H indicates the conjugate transpose of a matrix or a vector, wherein $\epsilon\{\cdot\}$ is an expectation operation, wherein $\beta$ is a real number with $\beta>0$, and wherein tr{ } is the trace of a matrix.

Another embodiment may have a computer program for implementing the above method when being executed on a computer or signal processor.

An apparatus for generating a modified audio signal comprising two or more modified audio channels from an audio input signal comprising two or more audio input channels is provided. The apparatus comprises an information generator for generating signal-to-downmix information. The information generator is adapted to generate signal information by combining a spectral value of each of the two or more audio input channels in a first way. Moreover, the information generator is adapted to generate downmix information by combining the spectral value of each of the two or more audio input channels in a second way being different from the first way. Furthermore, the information generator is adapted to combine the signal information and the downmix information to obtain signal-to-downmix information. Moreover, the apparatus comprises a signal attenuator for attenuating the two or more audio input channels depending on the signal-to-downmix information to obtain the two or more modified audio channels.

In a particular embodiment, the apparatus may, for example, be adapted to generate a modified audio signal comprising three or more modified audio channels from an audio input signal comprising three or more audio input channels.

In an embodiment, the number of the modified audio channels is equal to or smaller than the number of the audio input channels, or wherein the number of the modified audio channels is smaller than the number of the audio input channels. For example, according to a particular embodiment, the apparatus may be adapted to generate a modified audio signal comprising two or more modified audio channels from an audio input signal comprising two or more audio input channels, wherein the number of the modified audio channels is equal to the number of the audio input channels.

Embodiments provide new concepts for scaling the level of the virtual center in audio signals is proposed. The input signals are processed in the time-frequency domain such that direct sound components having approximately equal energy in all channels are amplified or attenuated. The real-valued spectral weights are obtained from the ratio of the sum of the power spectral densities of all input channel signals and the power spectral density of the sum signal. Applications of the presented concepts are upmixing two-channel stereophonic recordings for its reproduction using surround sound set-ups, stereophonic enhancement, dialogue enhancement, and as preprocessing for semantic audio analysis.

Embodiments provide new concepts for amplifying or attenuating the center signal in an audio signal. In contrast to previous concepts, both lateral displacement and diffuseness of the signal components are taken into account. Furthermore, the use of semantically meaningful parameters is discussed in order to support the user when implementations of the concepts are employed.

Some embodiments focus on center signal scaling, i.e., the amplification or attenuation of center signals in audio recordings. The center signal is, e.g., defined here as the sum of all direct signal components having approximately equal intensity in all channels and negligible time differences between the channels.

Various applications of audio signal processing and reproduction benefit from center signal scaling, e.g., upmixing, dialogue enhancement, and semantic audio analysis.

Upmixing refers to the process of creating an output signal given an input signal with less channels. Its main application is the reproduction of two-channel signals using surround sound setups as, for example, specified in International Telecommunication Union, Radiocommunication Assembly, "Multichannel stereophonic sound system with and without accompanying picture," *Recommendation ITU-R BS.*775-2, 2006, Geneva, Switzerland. Research on the subjective quality of spatial audio as described in J. Berg and F. Rumsey, "Identification of quality attributes of spatial sound by repertory grid technique," *J. Audio Eng. Soc.*, vol. 54, pp. 365-379, 2006, indicates that locatedness as described in J. Blauert, *Spatial Hearing*, MIT Press, 1996; localization and width are prominent descriptive attributes of sound. Results of a subjective assessment of two to five upmixing algorithms as described in F. Rumsey, "Controlled subjective assessment of two-to-five channel surround sound processing algorithms," *J. Audio Eng. Soc., vol.* 47, pp. 563-582, 1999, showed that the use of an additional center loudspeaker can narrow the stereophonic image. The presented work is motivated by the assumption that locatedness, localization, and width can be preserved or even improved when the additional center loudspeaker reproduces mainly direct signal components which are panned to the center, and when these signal components are attenuated in the off-center loudspeaker signals.

Dialogue enhancement refers to the improvement of speech intelligibility, e.g., in broadcast and movie sound, and is often desired when background sounds are too loud relative to the dialogue as described in H. Fuchs, S. Tuff, and C. Bustad, "Dialogue enhancement—technology and experiments," *EBU Technical Review*, vol. Q2, pp. 1-11, 2012. This applies in particular to persons who are hard of hearing, non-native listeners, in noisy environments, or when the binaural masking level difference is reduced due to narrow loudspeaker placement. The concepts method can be applied for processing input signals where the dialogue is panned to the center in order to attenuate background sounds and thereby enabling better speech intelligibility.

Semantic Audio Analysis (or Audio Content Analysis) comprises processes for deducing meaningful descriptors from audio signals, e.g., beat tracking or transcription of the leading melody. The performance of the computational methods is often deteriorated when the sounds of interest are embedded in background sounds (see, e.g., J.-H. Bach, J. Anemüller, and B. Kollmeier, "Robust speech detection in real acoustic backgrounds with perceptually motivated features," *Speech Communication*, vol. 53, pp. 690-706, 2011. Since it is common practice in audio production that sound sources of interest (e.g., leading instruments and singers) are panned to the center, center extraction can be applied as a preprocessing step for attenuating background sounds and reverberation.

According to an embodiment, the information generator may be configured to combine the signal information and the downmix information so that the signal-to-downmix information indicates a ratio of the signal information to the downmix information.

In an embodiment, the information generator may be configured to process the spectral value of each of the two or more audio input channels to obtain two or more processed values, and wherein the information generator may be configured to combine the two or more processed values to obtain the signal information. Moreover, the information generator may be configured to combine the spectral value of each of the two or more audio input channels to obtain a combined value, and wherein the information generator may be configured to process the combined value to obtain the downmix information.

According to an embodiment, the information generator may be configured to process the spectral value of each of the two or more audio input channels by multiplying said spectral value by the complex conjugate of said spectral value to obtain an auto power spectral density of said spectral value for each of the two or more audio input channels.

In an embodiment, the information generator may be configured to process the combined value by determining a power spectral density of the combined value.

According to an embodiment, the information generator may be configured to generate the signal information s(m, k, β) according to the formula:

$$s(m,k,\beta)=\Sigma_{i=1}^{N}\Phi_{i,i}(m,k)^{\beta},$$

wherein N indicates the number of audio input channels of the audio input signal, wherein $\Phi_{i,i}(m, k)$ indicates the auto power spectral density of the spectral value of the i-th audio signal channel, wherein β is a real number with β>0, wherein m indicates a time index, and wherein k indicates a frequency index. For example, according to a particular embodiment, β≥1.

In an embodiment, the information generator may be configured to determine the signal-to-downmix ratio as the signal-to-downmix information according to the formula R(m, k, β):

$$R(m,k,\beta)=\left(\frac{\sum_{i=1}^{N}\Phi_{i,i}(m,k)^{\beta}}{\Phi_{d}(m,k)^{\beta}}\right)^{\frac{1}{2\beta-1}},$$

wherein $\Phi_d(m, k)$ indicates the power spectral density of the combined value, and wherein $\Phi_d(m, k)^{\beta}$ is the downmix information.

According to an embodiment, the information generator may be configured to generate the signal information $\Phi_1(m, k)$ according to the formula:

$$\Phi_1(m,k)=\epsilon\{WX(m,k)(WX(m,k))^H\},$$

wherein the information generator is configured to generate the downmix information $\Phi_2(m, k)$ according to the formula:

$$\Phi_2(m,k)=\epsilon\{VX(m,k)(VX(m,k))^H\}, \text{ and}$$

wherein the information generator is configured to generate the signal-to-downmix ratio as the signal-to-downmix information $R_g(m, k, \beta)$ according to the formula:

$$R_g(m,k,\beta)=\left(\frac{tr\{\Phi_1(m,k)^{\beta}\}}{tr\{\Phi_2(m,k)^{\beta}\}}\right)^{\frac{1}{2\beta-1}}$$

wherein X(m, k) indicates the audio input signal, wherein $$X(m,k)=[X_1(m,k)\ldots X_N(m,k)]^T$$

wherein N indicates the number of audio input channels of the audio input signal, wherein indicates a time index, and wherein k indicates a frequency index, wherein $X_1(m, k)$ indicates the first audio input channel, wherein $X_N(m, k)$ indicates the N-th audio input channel, wherein V indicates a matrix or a vector, wherein W indicates a matrix or a vector, wherein H indicates the conjugate transpose of a matrix or a vector, wherein ϵ{•} is an expectation operation, wherein β is a real number with β>0, and wherein tr{ } is the trace of a matrix. For example, according to a particular embodiment β≥1.

In an embodiment, V may be a row vector of length N whose elements are equal to one and W may be the identity matrix of size N×N.

According to an embodiment, V=[1, 1], wherein W=[1, −1] and wherein N=2.

In an embodiment, the signal attenuator may be adapted to attenuate the two or more audio input channels depending on a gain function G(m, k) according to the formula:

$$Y(m,k)=G(m,k)X(m,k),$$

wherein the gain function G(m, k) depends on the signal-to-downmix information, and wherein the gain function G(m, k) is a monotonically increasing function of the signal-to-downmix information or a monotonically decreasing function of the signal-to-downmix information, wherein X(m, k) indicates the audio input signal, wherein Y(m, k) indicates the modified audio signal, wherein m indicates a time index, and wherein k indicates a frequency index.

According to an embodiment, the gain function G(m, k) may be a first function $G_{c_1}(m, k, \beta, \gamma)$, a second function $G_{c_2}(m, k, \beta, \gamma)$, a third function $G_{s_1}(m, k, \beta, \gamma)$ or a fourth function $G_{s_2}(m, k, \beta, \gamma)$, wherein $$G_{c_1}(m,k,\beta,\gamma)=(1+R_{min}-R(m,k,\beta))^{\gamma}, \text{ wherein}$$

$$G_{c_2}(m,k,\beta,\gamma)=\left(\frac{R_{min}}{R(m,k,\beta)}\right)^{\gamma},$$

wherein $$G_{s_1}(m,k,\beta,\gamma)=R(m,k,\beta)^{\gamma}, \text{ wherein}$$

$$G_{s_2}(m,k,\beta,\gamma)=\left(1+R_{min}-\frac{R_{min}}{R(m,k,\beta)}\right)^{\gamma},$$

wherein β is a real number with β>0, wherein γ is a real number with γ>0, and wherein $R_{min}$ indicates the minimum of R.

Moreover, a system is provided. The system comprises a phase compensator for generating a phase-compensated audio signal comprising two or more phase-compensated audio channels from an unprocessed audio signal comprising two or more unprocessed audio channels. Furthermore, the system comprises an apparatus according to one of the above-described embodiments for receiving the phase compensated audio signal as an audio input signal and for generating a modified audio signal comprising two or more modified audio channels from the audio input signal comprising the two or more phase-compensated audio channels as two or more audio input channels. One of the two or more unprocessed audio channels is a reference channel. The phase compensator is adapted to estimate for each unprocessed audio channel of the two or more unprocessed audio channels which is not the reference channel a phase transfer function between said unprocessed audio channel and the reference channel. Moreover, the phase compensator is adapted to generate the phase-compensated audio signal by modifying each unprocessed audio channel of the unprocessed audio channels which is not the reference channel depending on the phase transfer function of said unprocessed audio channel.

Furthermore, a method for generating a modified audio signal comprising two or more modified audio channels from an audio input signal comprising two or more audio input channels is provided. The method comprises:

Generating signal information by combining a spectral value of each of the two or more audio input channels in a first way;

Generating downmix information by combining the spectral value of each of the two or more audio input channels in a second way being different from the first way;

Generating signal-to-downmix information by combining the signal information and the downmix information; and Attenuating the two or more audio input channels depending on the signal-to-downmix information to obtain the two or more modified audio channels.

BRIEF DESCRIPTION OF THE DRAWINGS

In the following, embodiments of the present invention are described in more detail with reference to the figures, in which.

DETAILED DESCRIPTION OF THE INVENTION

Figure 1:
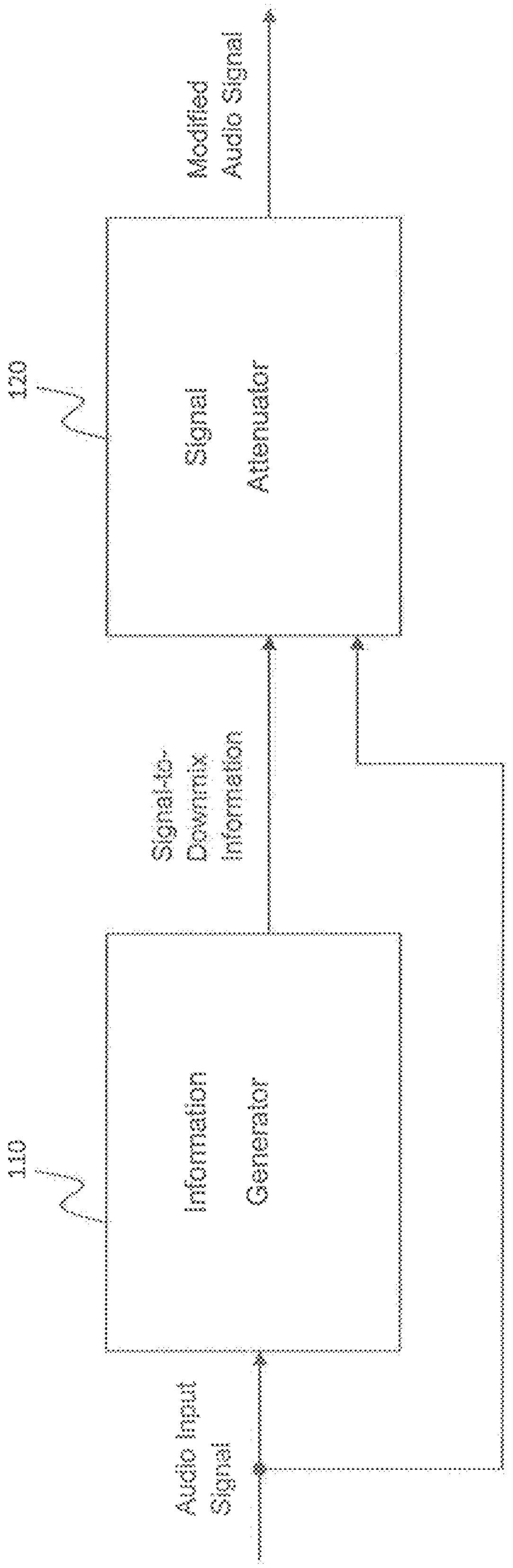
FIG. 1 illustrates an apparatus according to an embodiment.

FIG. 1 illustrates an apparatus for generating a modified audio signal comprising two or more modified audio channels from an audio input signal comprising two or more audio input channels according to an embodiment.

The apparatus comprises an information generator 110 for generating signal-to-downmix information.

The information generator 110 is adapted to generate signal information by combining a spectral value of each of the two or more audio input channels in a first way. Moreover, the information generator 110 is adapted to generate downmix information by combining the spectral value of each of the two or more audio input channels in a second way being different from the first way.

Furthermore, the information generator 110 is adapted to combine the signal information and the downmix information to obtain signal-to-downmix information. For example, the signal-to-downmix information may be a signal-to-downmix ratio, e.g., a signal-to-downmix value.

Moreover, the apparatus comprises a signal attenuator 120 for attenuating the two or more audio input channels depending on the signal-to-downmix information to obtain the two or more modified audio channels.

According to an embodiment, the information generator may be configured to combine the signal information and the downmix information so that the signal-to-downmix information indicates a ratio of the signal information to the downmix information. For example, the signal information may be a first value and the downmix information may be a second value and the signal-to-downmix information indicates a ratio of the signal value to the downmix value. For example, the signal-to-downmix information may be the first value divided by the second value. Or, for example, if the first value and the second value are logarithmic values, the signal-to-downmix information may be the difference between the first value and the second value.

In the following, the underlying signal model and the concepts are described and analyzed for the case of input signal featuring amplitude difference stereophony.

The rationale is to compute and apply real-valued spectral weights as a function of the diffuseness and the lateral position of direct sources. The processing as demonstrated here is applied in the STFT domain, yet it is not restricted to a particular filterbank. The N channel input signal is denoted by:

$$x[n]=[x_1[n]\ \ldots\ x_N[n]]^T, \tag{1}$$

where n denotes the discrete time index. The input signal is assumed to be an additive mixture of direct signals $s_i[n]$ and ambient sounds $a_l[n]$, $$x_l[n] = \sum_{i=1}^{K} d_{i,l}[n] * s_i[n] + a_l[n], \quad l = 1, \ldots, N \tag{2}$$

where P is the number of sound sources, $d_{i,l}[n]$ denotes the impulse responses of the direct paths of the i-th source into the l-th channel of length $L_{i,l}$ samples, and the ambient signal components are mutually uncorrelated or weakly correlated. In the following description, it is assumed that the signal model corresponds to amplitude difference stereophony, i.e., $L_{i,l}=1$, ∀i, l.

The time-frequency domain representation of X[n] is given by:

$$X(m,k)=[X_1(m,k)\ \ldots\ X_N(m,k)]^T, \tag{3}$$

with time index m and frequency index k. The output signals are denoted by:

$$Y(m,k)=[Y_1(m,k) \ldots Y_N(m,k)]^T, \quad (4)$$

and are obtained by means of spectral weighting $$Y(m,k)=G(m,k)X(m,k), \quad (5)$$

with real-valued weights G(m, k). Time domain output signals are computed by applying the inverse processing of the filterbank. For the computation of the spectral weights, the sum signal, thereafter denoted as the downmix signal, is computed as:

$$X_d(m,k)=\sum_{i=1}^{N} X_i(m,k), \quad (6)$$

The matrix of PSD of the input signal, comprising estimates of the (auto-)PSD on the main diagonal, while off-diagonal elements are estimates of the cross-PSD, is given by:

$$\Phi_{i,l}(m,k)=\epsilon\{X_i(m,k)X_l^*(m,k)\},\ i,l=1 \ldots N, \quad (7)$$

where X* denotes the complex conjugate of X, and $\epsilon\{\bullet\}$ is the expectation operation with respect to the time dimension. In the presented simulations the expectation values are estimated using single-pole recursive averaging:

$$\Phi_{i,l}(m,k)=\alpha X_i(m,k)X_l^*(m,k)+(1-\alpha)\Phi_{i,l}(m-1,k), \quad (8)$$

where the filter coefficient α determines the integration time. Furthermore, the quantity R(m, k; β) is defined as:

$$R(m,k,\beta)=\left(\frac{\sum_{i=1}^{N}\Phi_{i,i}(m,k)^{\beta}}{\Phi_d(m,k)^{\beta}}\right)^{\frac{1}{2\beta-1}}. \quad (9)$$

where $\Phi_d(m, k)$ is the PSD of the downmix signal and β is a parameter which will be addressed in the following. The quantity R(m, k; 1) is the signal-to-downmix ratio (SDR), i.e., the ratio of the total PSD and the PSD of the downmix signal. The power to $$\frac{1}{2\beta-1}$$

ensures that the range of R(m, k; β) is independent of β.

The information generator 110 may be configured to determine the signal-to-downmix ratio according to Equation (9).

According to Equation (9), the signal information s(m, k, β) that may be determined by the information generator 110 is defined as:

$$s(m,k,\beta)=\Sigma_{i=1}^{N}\Phi_{i,i}(m,k)^{\beta}.$$

As can be seen above, $\Phi_{i,i}(m, k)$ is defined as $\Phi_{i,i}(m, k)=\epsilon\{X_i(m, k)X_i^*(m, k)\}$. Thus, to determine the signal information s(m, k, β), the spectral value $X_i(m, k)$ of each of the two or more audio input channels is processed to obtain the processed value $\Phi_{i,i}(m, k)^{\beta}$ for each of the two or more audio input channels, and the obtained processed values $\Phi_{i,i}(m, k)^{\beta}$ are then combined, e.g., as in Equation (9) by summing up the obtained processed values $\Phi_{i,i}(m, k)^{\beta}$.

Thus, the information generator 110 may be configured to process the spectral value $X_i(m, k)$ of each of the two or more audio input channels to obtain two or more processed values $\Phi_{i,i}(m, k)^{\beta}$, and the information generator 110 may be configured to combine the two or more processed values to obtain the signal information s(m, k, β). In more general, the information generator 110 is adapted to generate signal information s(m, k, β) by combining a spectral value $X_i(m, k)$ of each of the two or more audio input channels in a first way.

Moreover, according to Equation (9), the downmix information d (m, k, β) that may be determined by the information generator 110 is defined as:

$$d(m,k,\beta)=\Phi_d(m,k)^{\beta}.$$

To form $\Phi_d(m, k)$, at first $X_d(m, k)$ is formed according to the above Equation (6):

$$X_d(m,k)=\sum_{i=1}^{N} X_i(m,k).$$

As can be seen, at first, the spectral value $X_i(m, k)$ of each of the two or more audio input channels is combined to obtain a combined value $X_d(m, k)$, e.g., as in Equation (6), by summing up the spectral value $X_i(m, k)$ of each of the two or more audio input channels.

Then, to obtain $\Phi_d(m, k)$, the power spectral density of $X_d(m, k)$ is formed, e.g., according to:

$$\Phi_d(m,k)=\{X_d(m,k)X_d^*(m,k)\},$$

and then $\Phi_d(m, k)^{\beta}$ may be determined. More generally speaking, the obtained combined value $X_d(m, k)$ has been processed to obtain the downmix information $d(m, k, \beta)=\Phi_d(m, k)^{\beta}$.

Thus, the information generator 110 may be configured to combine the spectral value $X_i(m, k)$ of each of the two or more audio input channels to obtain a combined value, and the information generator 110 may be configured to process the combined value to obtain the downmix information d (m, k, β). In more general, the information generator 110 is adapted to generate downmix information d(m, k, β) by combining the spectral value $X_i(m, k)$ of each of the two or more audio input channels in a second way. The way, how the downmix information is generated ("second way") differs from the way, how the signal information is generated ("first way") and thus, the second way is different from the first way.

The information generator 110 is adapted to generate signal information by combining a spectral value of each of the two or more audio input channels in a first way. Moreover, the information generator 110 is adapted to generate downmix information by combining the spectral value of each of the two or more audio input channels in a second way being different from the first way.

Figure 2:
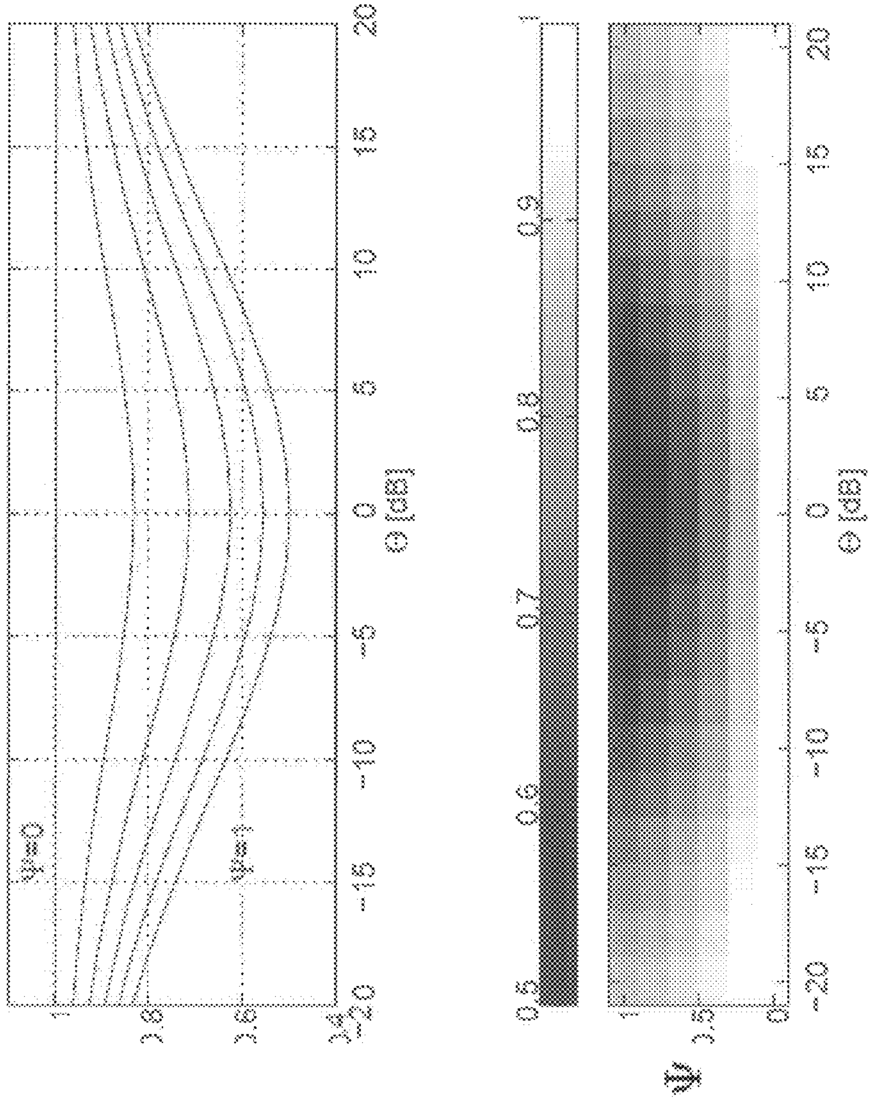
FIG. 2 illustrates the signal-to-downmix ratio as function of the inter-channel level differences and as a function of the inter-channel coherence according to an embodiment.

FIG. 2, upper plot illustrates the signal-to-downmix ratio R(m, k; 1) for N=2 as function of the ICLD Θ(m, k), shown for $\Psi(m, k)\epsilon\{0, 0.2, 0.4, 0.6, 0.8, 1\}$. FIG. 2, lower plot illustrates the signal-to-downmix ratio R(m, k; 1) for N=2 as function of ICC Ψ(m, k) and ICLD Θ(m, k) in color-coded 2D-plot.

In particular, FIG. 2 illustrates the SDR for N=2 as a function of ICC Ψ(m, k) and ICLD Θ(m, k), with $$\Psi(m,k)=\frac{|\Phi_{1,2}(m,k)|}{\sqrt{\Phi_{1,1}(m,k)\Phi_{2,2}(m,k)}}, \quad (10)$$

and $$\Theta(m,k)=\frac{\Phi_{1,1}(m,k)}{\Phi_{2,2}(m,k)}. \quad (11)$$

FIG. 2 shows that the SDR has the following properties:

1. It is monotonically related to both Ψ(m, k) and |log Θ(m, k)|.
2. For diffuse input signals, i.e., Ψ(m, k)=0, the SDR assumes its maximum value, R(m, k; 1)=1.
3. For direct sounds panned to the center, i.e., Θ((m, k)=1, the SDR assumes its minimum value $R_{min}$, where $R_{min}$=0.5 for N=2.

Due to these properties, appropriate spectral weights for center signal scaling can be computed from the SDR by using monotonically decreasing functions for the extraction of center signals and monotonically increasing functions for the attenuation of center signals.

For the extraction of a center signal, appropriate functions of R(m, k; β) are, for example:

$$G_{c_1}(m,k,\beta,\gamma)=(1+R_{min}-R(m,k,\beta))^{\gamma}, \quad (12)$$

and $$G_{c_2}(m,k,\beta,\gamma)=\left(\frac{R_{min}}{R(m,k,\beta)}\right)^{\gamma}. \quad (13)$$

where a parameter for controlling the maximum attenuation is introduced.

For the attenuation of the center signal, appropriate functions of R(m, k; β) are, for example, $$G_{s_1}(m,k,\beta,\gamma)=R(m,k,\beta)^{\gamma}. \quad (14)$$

and $$G_{s_2}(m,k,\beta,\gamma)=\left(1+R_{min}-\frac{R_{min}}{R(m,k,\beta)}\right)^{\gamma}, \quad (15)$$

Figure 3:
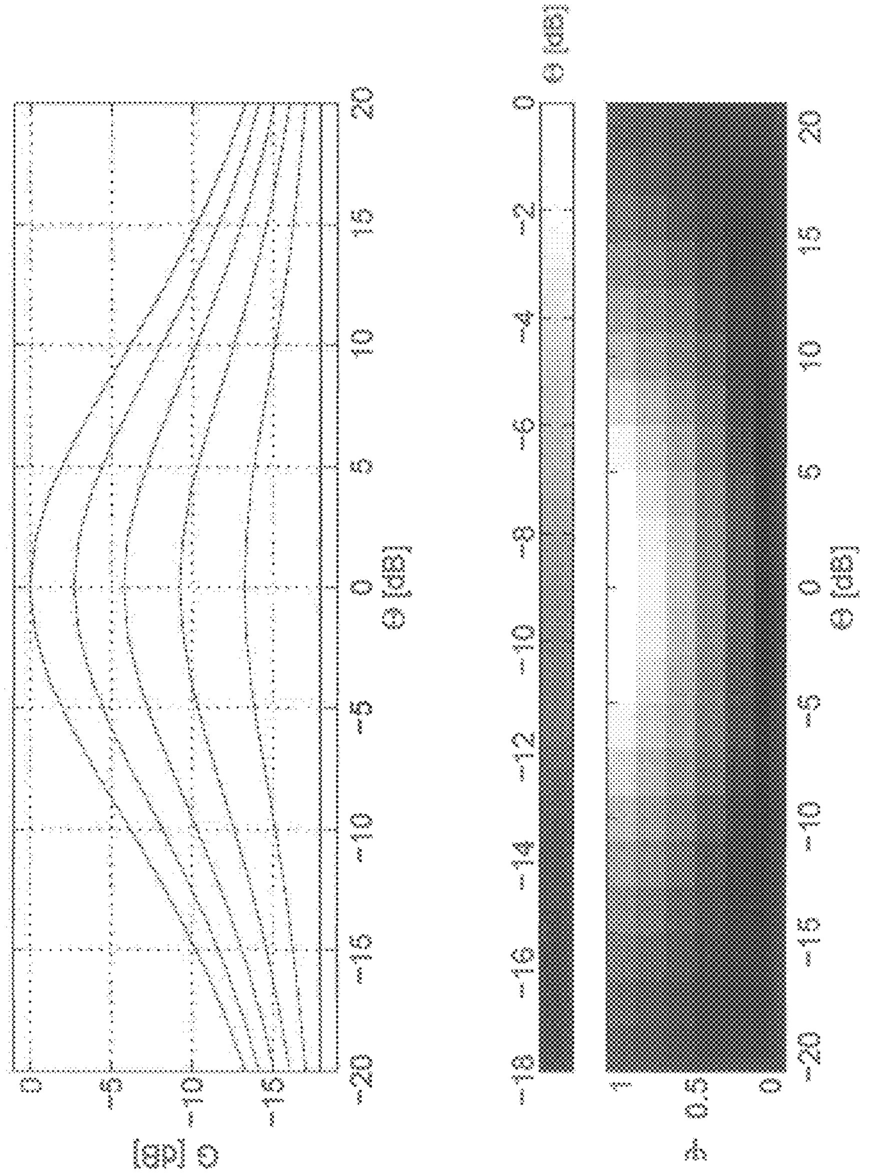
FIG. 3 illustrates spectral weights as a function of the inter-channel coherence and of the inter-channel level differences according to an embodiment.
Figure 4:
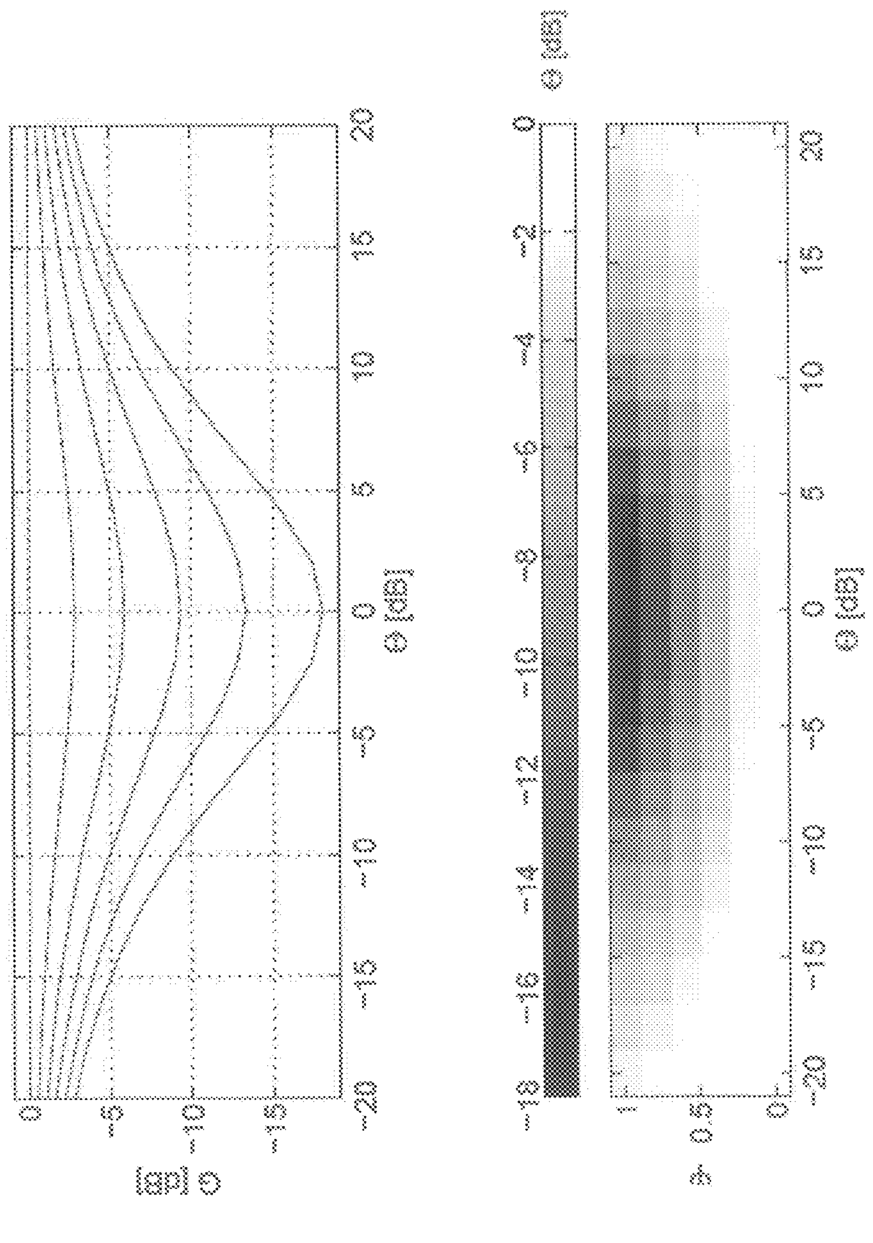
FIG. 4 illustrates spectral weights as a function of the inter-channel coherence and of the inter-channel level differences according to another embodiment.

FIGS. 3 and 4 illustrate the gain functions (13) and (15), respectively, for β=1, γ=3. The spectral weights are constant for Ψ(m, k)=0. The maximum attenuation is γ 6 dB, which also applies to the gain functions (12) and (14).

In particular, FIG. 3 illustrates spectral weights $G_{c_2}$(m, k; 1, 3) in dB as function of ICC Ψ(m, k) and ICLD Θ(m, k).

Moreover, FIG. 4 illustrates spectral weights $G_{s_2}$ (m, k; 1, 3) in dB as function of ICC Ψ(m, k) and ICLD Θ(m, k).

Figure 5:
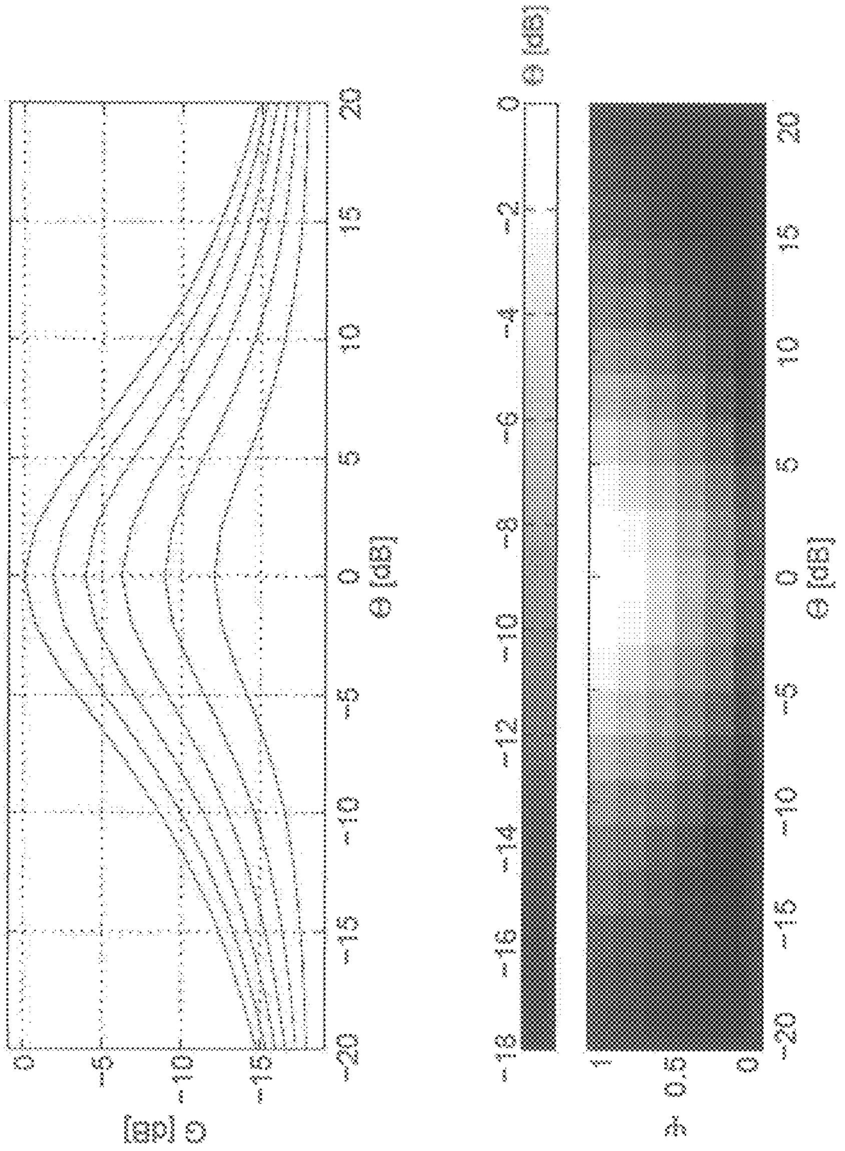
FIG. 5 illustrates spectral weights as a function of the inter-channel coherence and of the inter-channel level differences according to a further embodiment.

Furthermore, FIG. 5 illustrates spectral weights $G_{c_2}$(m, k; 2, 3) in dB as function of ICC Ψ(m, k) and ICLD Θ(m, k).

The effect of the parameter β is shown in FIG. 5 for the gain function in Equation (13) with β=2, γ=3. With larger values for β, the influence of Ψ on the spectral weights decreases whereas the influence of Θ increases. This leads to more leakage of diffuse signal components into the output signal, and to more attenuation of the direct signal components panned off-center, when comparing to the gain function in FIG. 3.

Post-processing of spectral weights: Prior to the spectral weighting, the weights G(m, k; β, γ) can be further processed by means of smoothing operations. Zero phase low-pass filtering along the frequency axis reduces circular convolution artifacts which can occur for example when the zero-padding in the STFT computation is too short or a rectangular synthesis window is applied. Low-pass filtering along the time axis can reduce processing artifacts, especially when the time constant for the PSD estimation is rather small.

In the following, generalized spectral weights are provided.

More general spectral weights are obtained when rewriting Equation (9) as:

$$R_g(m,k,\beta)=\left(\frac{tr\{\Phi_1(m,k)^{\beta}\}}{tr\{\Phi_2(m,k)^{\beta}\}}\right)^{\frac{1}{2\beta-1}}, \quad (16)$$

with $$\Phi_1(m,k)=\epsilon\{WX(m,k)(WX(m,k))^H\} \quad (17)$$

$$\Phi_2(m,k)=\epsilon\{VX(m,k)(VX(m,k))^H\} \quad (18)$$

where superscript $^H$ denotes the conjugate transpose of a matrix or a vector, and W and V are mixing matrices or mixing (row) vectors.

Here, $\Phi_1$(m, k) may be considered as signal information and $\Phi_2$(m, k) may be considered as downmix information.

For example, $\Phi_2=\Phi_d$ when V is a vector of length N whose elements are equal to one. Equation (16) is equal to (9) when V is a row vector of length N whose elements are equal to one and W is the identity matrix of size N×N.

The generalized SDR $R_g$(m, k, β, W, V) covers, for example, the ratio of the PSD of the side signal and of the PSD of the downmix signal, for W=[1, −1], V=[1, 1], and N=2:

$$R(m,k,\beta)=\left(\frac{\Phi_s(m,k)^{\beta}}{\Phi_d(m,k)^{\beta}}\right)^{\frac{1}{2\beta-1}} \quad (19)$$

where $\Phi_s$(m, k) is the PSD of the side signal.

According to an embodiment, the information generator 110 is adapted to generate signal information $\Phi_1$(m, k) by combining a spectral value $X_i$(m, k) of each of the two or more audio input channels in a first way. Moreover, the information generator 110 is adapted to generate downmix information $\Phi_2$(m, k) by combining the spectral value $X_i$(m, k) of each of the two or more audio input channels in a second way being different from the first way.

In the following, a more general case of mixing models featuring time-of-arrival stereophony is described.

The derivation of the spectral weights described above relies on the assumption that $L_{i,l}$=1, ∀i, l, i.e., the direct sound sources are time-aligned between the input channels. When the mixing of the direct source signals is not restricted to amplitude difference stereophony ($L_{i,l}$>1), for example when recording with spaced microphones, the downmix of the input signal $X_d$(m, k) is subject to phase cancellation. Phase cancellation in $X_d$(m, k) leads to increasing SDR values and consequently to the typical comb-filtering artifacts when applying the spectral weighting as described above.

The notches of the comb-filter correspond to the frequencies:

$$f_n = \frac{of_e}{2d}$$

for gain functions (12) and (13) and $$f_n = \frac{ef_s}{2d}$$

for gain functions (14) and (15), where $f_s$ is the sampling frequency, o are odd integers, e are even integers, and d is the delay in samples.

A first approach to solve this problem is to compensate the phase differences resulting from the ICTD prior to the computation of $X_d(m, k)$. Phase difference compensation (PDC) is achieved by estimating the time-variant inter-channel phase transfer function $\hat{P}_i(m, k)\hat{P}_i(m, k)\in[-\pi\ \pi]$ between the i-th channel and a reference channel denoted by index r:

$$\hat{P}_i(m,k)=\arg X_r(m,k)-\arg X_i(m,k),\ i\in[1, \ldots ,N]\backslash r \quad (20)$$

where the operator A\B denotes set-theoretic difference of set B and set A, and applying a time-variant allpass compensation filter $H_{C,i}(m, k)$ to the i-th channel signal:

$$\tilde{X}_i(m,k)=H_{C,i}(m,k)X_i(m,k). \quad (21)$$

where the phase transfer function of $H_{C,i}(m, k)$ is:

$$\arg H_{C,i}(m,k)=-\epsilon\{\hat{P}_i(m,k)\}. \quad (22)$$

The expectation value is estimated using single-pole recursive averaging. It should be noted that phase jumps of $2\pi$ occurring at frequencies close to the notch frequencies need to be compensated for prior to the recursive averaging.

The downmix signal is computed according to:

$$X_d(m, k) = \sum_{i=1}^{N} \tilde{X}_i(m, k). \quad (23)$$

such that the PDC is only applied for computing $X_d$ and does not affect the phase of the output signal.

Figure 13:
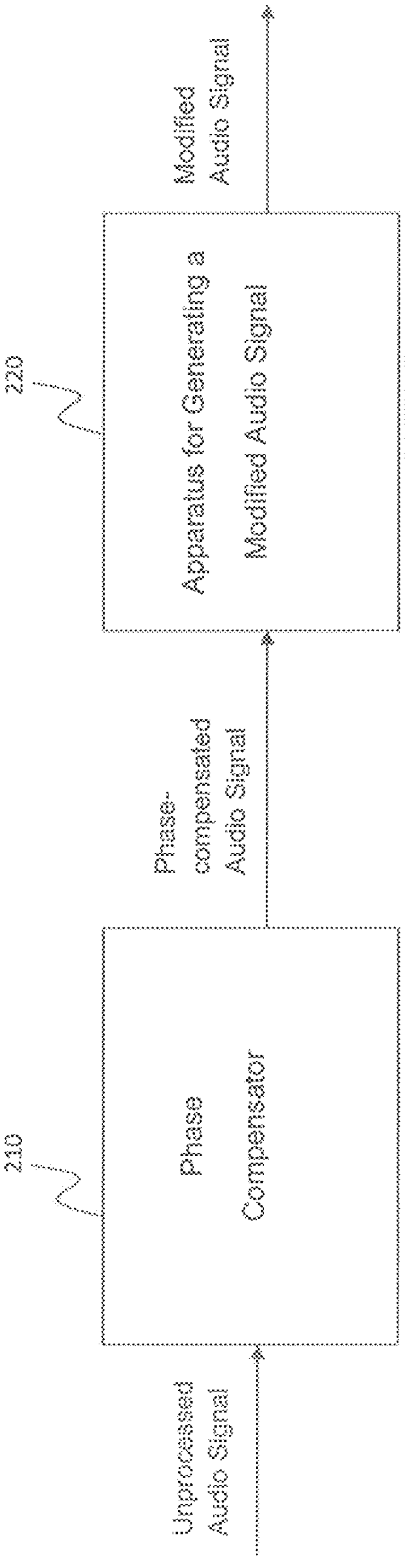
FIG. 13 illustrates a system according to an embodiment.

FIG. 13 illustrates a system according to an embodiment.

The system comprises a phase compensator 210 for generating a phase-compensated audio signal comprising two or more phase-compensated audio channels from an unprocessed audio signal comprising two or more unprocessed audio channels.

Furthermore, the system comprises an apparatus 220 according to one of the above-described embodiments for receiving the phase compensated audio signal as an audio input signal and for generating a modified audio signal comprising two or more modified audio channels from the audio input signal comprising the two or more phase-compensated audio channels as two or more audio input channels.

One of the two or more unprocessed audio channels is a reference channel. The phase compensator 210 is adapted to estimate for each unprocessed audio channel of the two or more unprocessed audio channels which is not the reference channel a phase transfer function between said unprocessed audio channel and the reference channel. Moreover, the phase compensator 210 is adapted to generate the phase-compensated audio signal by modifying each unprocessed audio channel of the unprocessed audio channels which is not the reference channel depending on the phase transfer function of said unprocessed audio channel.

In the following, intuitive explanations of the control parameters are provided, e.g., a semantic meaning of control parameters.

For the operation of digital audio effects it is advantageous to provide controls with semantically meaningful parameters. The gain functions (12)-(15) are controlled by the parameters $\alpha$, $\beta$ and $\gamma$. Sound engineers and audio engineers are used to time constants, and specifying $\alpha$ as time constant is intuitive and according to common practice. The effect of the integration time can be experienced best by experimentation. In order to support the operation of the provided concepts, descriptors for the remaining parameters are proposed, namely impact for $\gamma$ and diffuseness for $\beta$.

The parameter impact can be best compared with the order of a filter. By analogy to the roll-off in filtering, the maximum attenuation equals $\gamma$ 6 dB, for N=2.

The label diffuseness is proposed here to emphasize the fact that then attenuating panned and diffuse sounds, larger values of $\beta$ result in more leakage of diffuse sounds. A nonlinear mapping of the user parameter $\beta_u$, e.g., $\beta=\sqrt{\beta_u+1}$, with $0\leq\beta_u\leq 10$, is advantageous in a way that it enables a more consistent behavior of the processing as opposed to when modifying $\beta$ directly (where consistency relates to the effect of a change of the parameter on the result throughout the range of the parameter value).

In the following, computational complexity and memory requirements are briefly discussed.

The computational complexity and memory requirements scale with the number of bands of the filterbank and depend on the implementation of additional post-processing of the spectral weights. A low-cost implementation of the method can be achieved when setting $\beta=1$, $\gamma\in\mathbb{N}$, computing spectral weights according to Equation (12) or (14), and when not applying the PDC filter. The computation of the SDR uses only one cost intensive nonlinear functions per sub-band when $\beta\in\mathbb{N}$. For $\beta=1$, only two buffers for the PSD estimation are necessitated, whereas methods making explicit use of the ICC, e.g., as described in C. Avendano and J.-M. Jot, "A frequency-domain approach to multi-channel upmix," *J. Audio Eng. Soc.*, vol. 52, 2004; D. Jang, J. Hong, H. Jung, and K. Kang, "Center channel separation based on spatial analysis," in *Proc. Int. Conf. Digital Audio Effects* (*DAFx*), 2008; U.S. Pat. No. 7,630,500 B1, issued to P. E. Beckmann, 2009; U.S. Pat. No. 7,894,611 B2, issued to P. E. Beckmann, 2011; and J. Merimaa, M. Goodwin, and J.-M. Jot, "Correlation-based ambience extraction from stereo recordings," in *Proc. Audio Eng. Soc.* 123*rd Conv.,* 2007, necessitate at least three buffers.

In the following, the performance of the presented concepts by means of examples is discussed.

First, the processing is applied to an amplitude-panned mixture of 5 instrument recordings (drums, bass, keys, 2 guitars) sampled at 44100 Hz of which an excerpt of 3 seconds length is visualized. Drums, bass, and keys are panned to the center, one guitar is panned to the left channel and the second guitar is panned to the right channel, both with |ICLD|=20 dB. A convolution reverb having stereo impulse responses with an RT60 of about 1.4 seconds per input channel is used to generate ambient signal components. The reverberated signal is added with a direct-to-ambient ratio of about 8 dB after K-weighting as described in International Telecommunication Union, Radiocommunication Assembly, “Algorithms to measure audio programme loudness and true-peak audio level,” *Recommendation ITUR BS.*1770-2, March 2011, Geneva, Switzerland.

FIGS. 6A-6E show spectrograms the direct source signals and the left and right channel signals of the mixture signal. The spectrograms are computed using an STFT with a length of 2048 samples, 50% overlap, a frame size of 1024 samples and a sine window. Please note that for the sake of clarity only the magnitudes of the spectral coefficients corresponding to frequencies up to 4 kHz are displayed. In particular, FIGS. 6A-6E illustrate input signals for the music example.

Figure 6A:
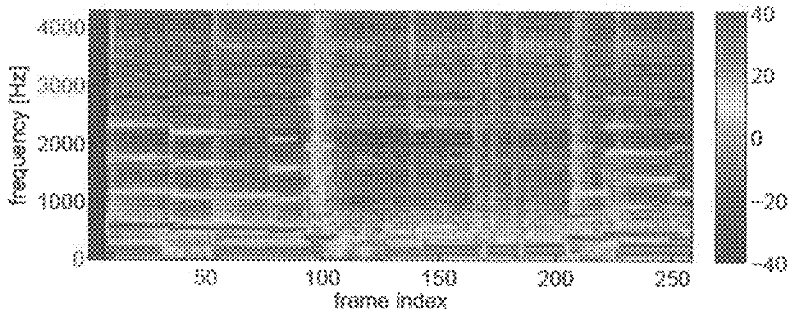
FIGS. 6A-6E illustrate spectrograms the direct source signals and the left and right channel signals of the mixture signal.
Figure 6B:
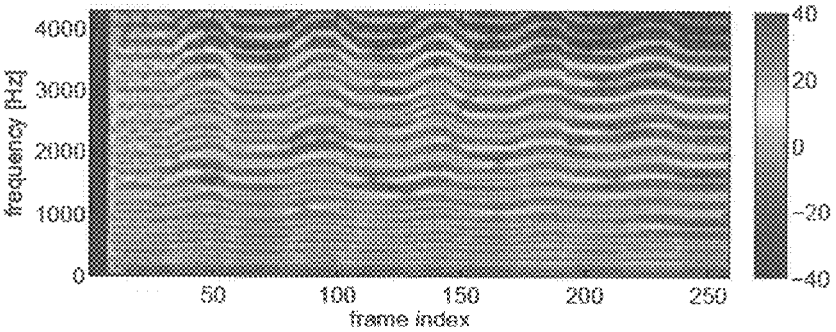
Figure 6C:
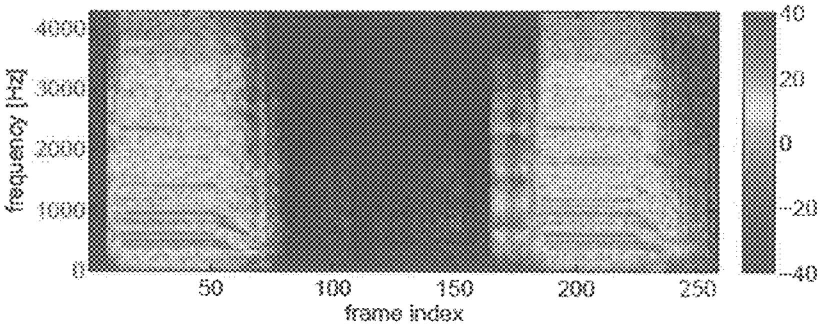
Figure 6D:
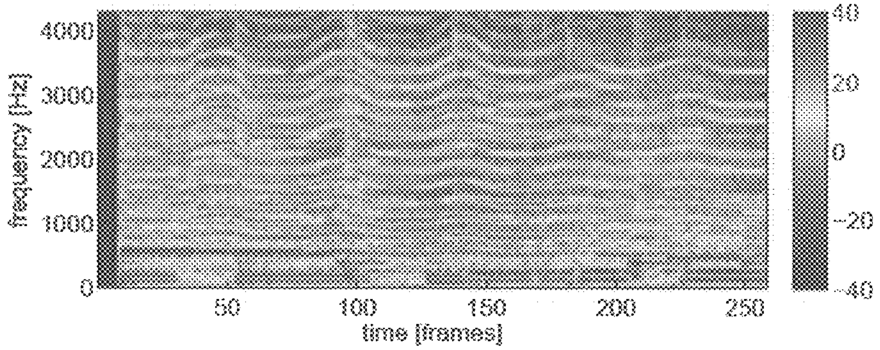
Figure 6E:
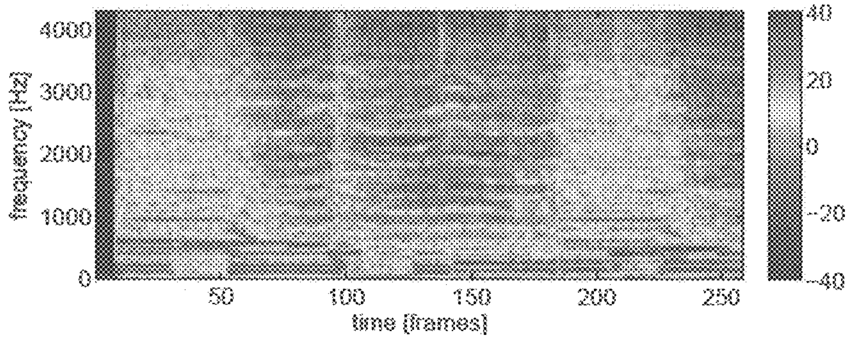

In particular, FIGS. 6A-6E illustrate in FIG. 6A source signals, wherein drums, bass, and keys are panned to the center; in FIG. 6B source signals, wherein guitar 1 in the mix is panned to left; in FIG. 6C source signals wherein guitar 2 in the mix is panned to right; in FIG. 6D a left channel of a mixture signal; and in FIG. 6R a right channel of a mixture signal.

Figure 7:
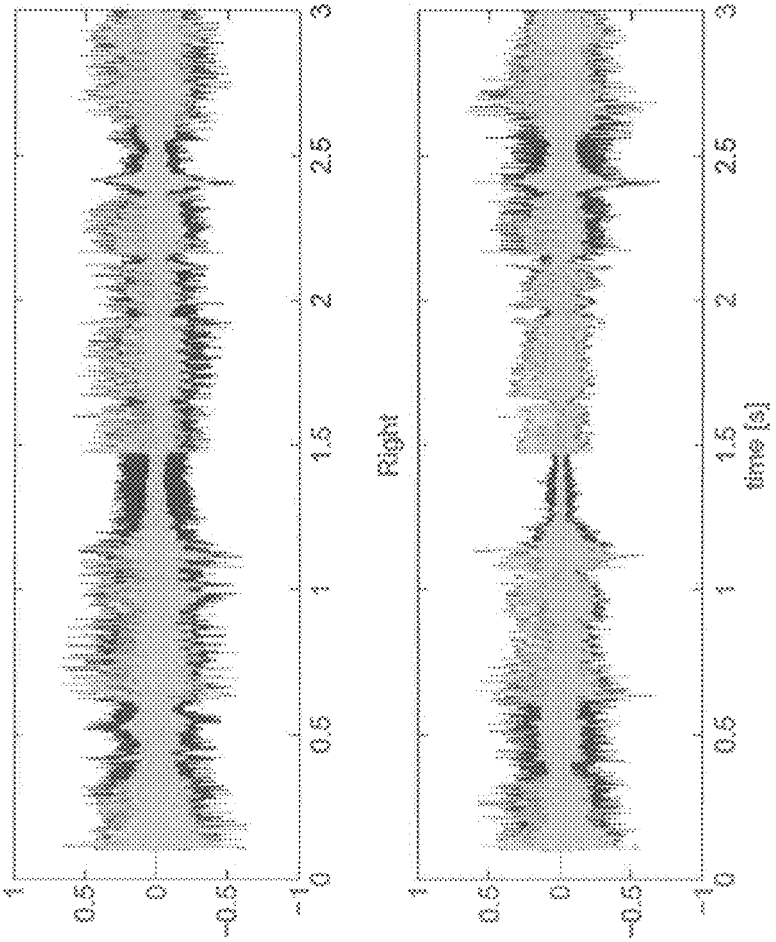
FIG. 7 illustrates the input signal and the output signal for the center signal extraction according to an embodiment.

FIG. 7 shows the input signal and the output signal for the center signal extraction obtained by applying $G_{c2}(m, k; 1, 3)$. In particular, FIG. 7 is an example for center extraction, wherein input time signals (black) and output time signals (overlaid in gray) are illustrated, wherein FIG. 7, upper plot illustrates a left channel, and wherein FIG. 7, lower plot illustrates a right channel.

The time constant for the recursive averaging in the PSD estimation here and in the following is set to 200 ms.

Figure 8:
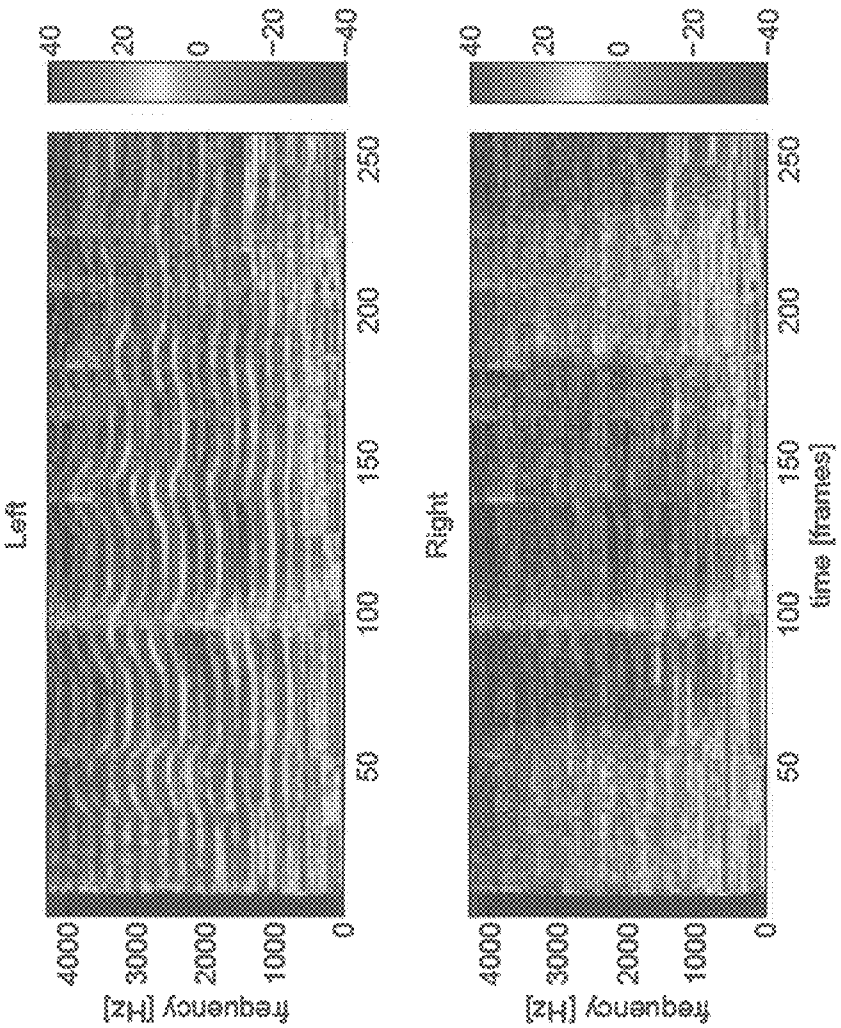
FIG. 8 illustrates the spectrograms of the output signal according to an embodiment.

FIG. 8 illustrates the spectrograms of the output signal. Visual inspection reveals that the source signals panned off-center (shown in FIGS. 6B and 6C) are largely attenuated in the output spectrograms. In particular, FIG. 8 illustrates an example for center extraction, more particularly spectrograms of the output signals. The output spectrograms also show that the ambient signal components are attenuated.

Figure 9:
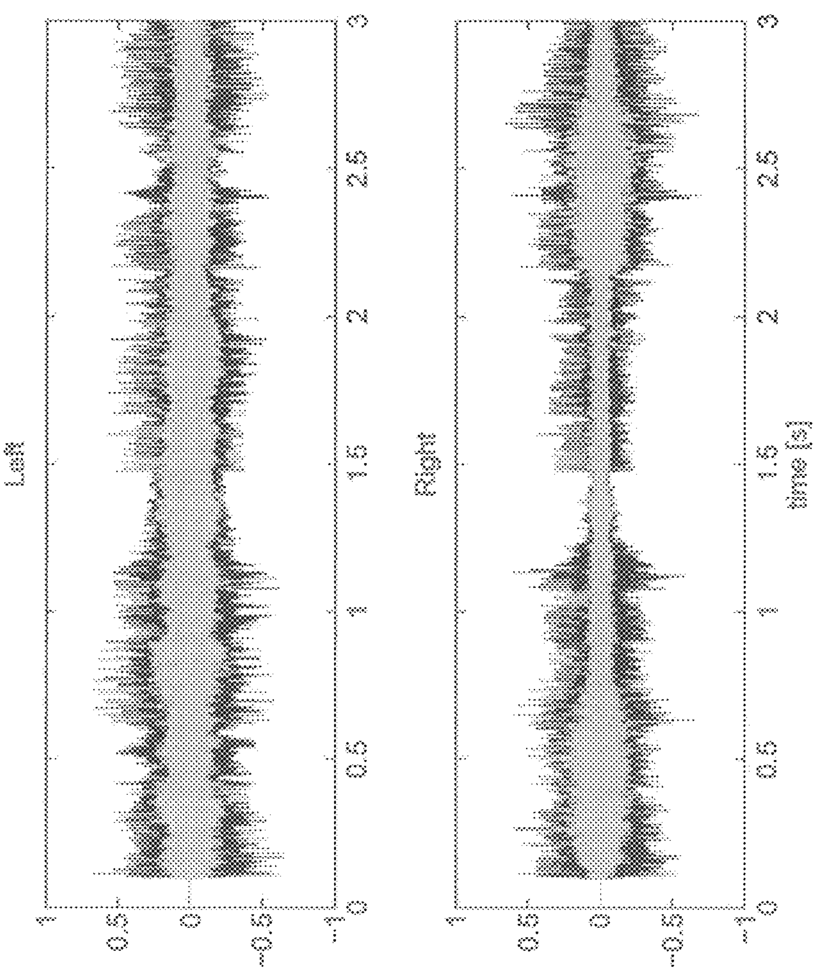
FIG. 9 illustrates the input signal and the output signal for the center signal attenuation according to another embodiment.

FIG. 9 shows the input signal and the output signal for the center signal attenuation obtained by applying $G_{s2}$ (m, k; 1, 3). The time signals illustrate that the transient sounds from the drums are attenuated by the processing. In particular, FIG. 9 illustrates an example for center attenuation, wherein input time signals (black) and output time signals (overlaid in gray) are illustrated.

Figure 10:
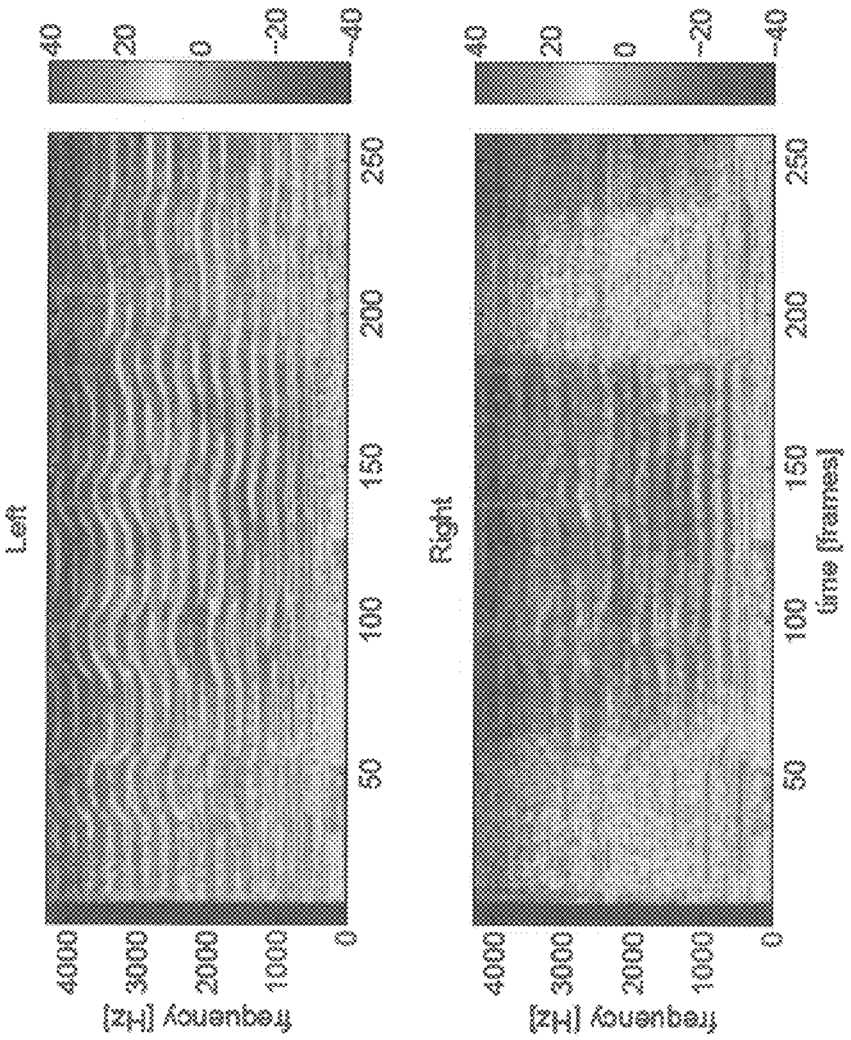
FIG. 10 illustrates the spectrograms of the output signal according to an embodiment.

FIG. 10 illustrates the spectrograms of the output signal. It can be observed that the signals panned to the center are attenuated, for example when looking at the transient sound components and the sustained tones in the lower frequency range below 600 Hz and comparing to FIG. 6A. The prominent sounds in the output signal correspond to the off-center panned instruments and the reverberation. In particular, FIG. 10 illustrates an example for center attenuation, more particularly, spectrograms of the output signals.

Informal listening over headphones reveals that the attenuation of the signal components is effective. When listening to the extracted center signal, processing artifacts become audible as slight modulations during the notes of guitar 2, similar to pumping in dynamic range compression. It can be noted that the reverberation is reduced and that the attenuation is more effective for low frequencies than for high frequencies. Whether this is caused by the larger direct-to-ambient ratio in the lower frequencies, the frequency content of the sound sources or subjective perception due to unmasking phenomena cannot be answered without a more detailed analysis.

When listening to the output signal where the center is attenuated, the overall sound quality is slightly better when compared to the center extraction result. Processing artifacts are audible as slight movements of the panned sources towards the center when dominant centered sources are active, equivalently to the pumping when extracting the center. The output signal sounds less direct as the result of the increased amount of ambience in the output signal.

Figure 11A:
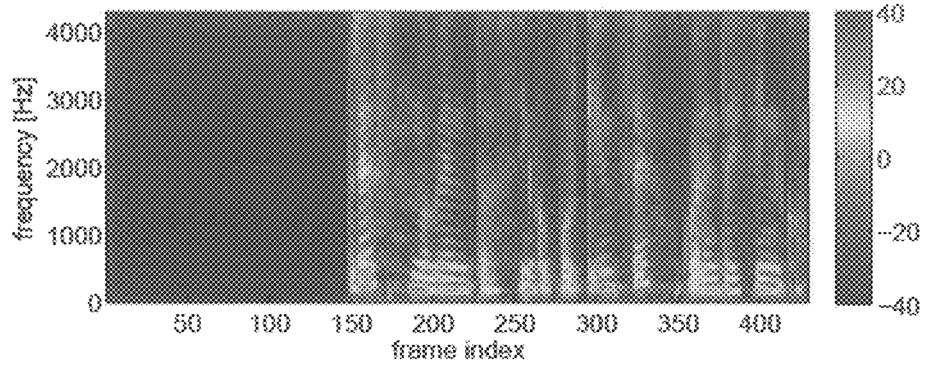
FIGS. 11A-11D illustrate two speech signals which have been mixed to obtain input signals with and without inter-channel time differences.
Figure 11B:
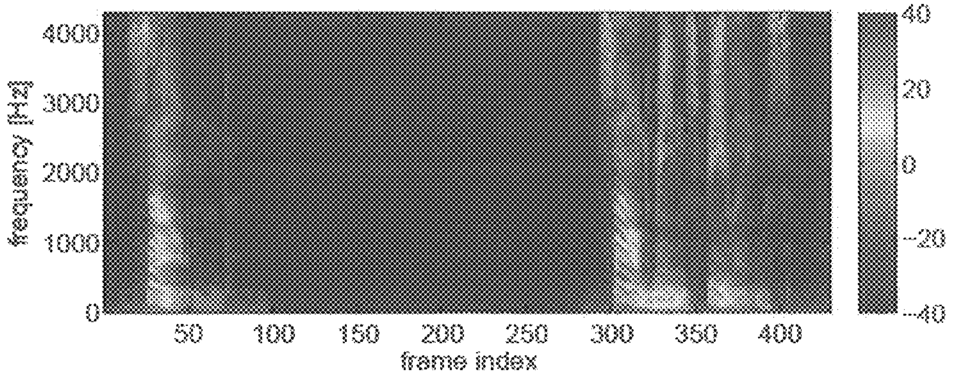
Figure 11C:
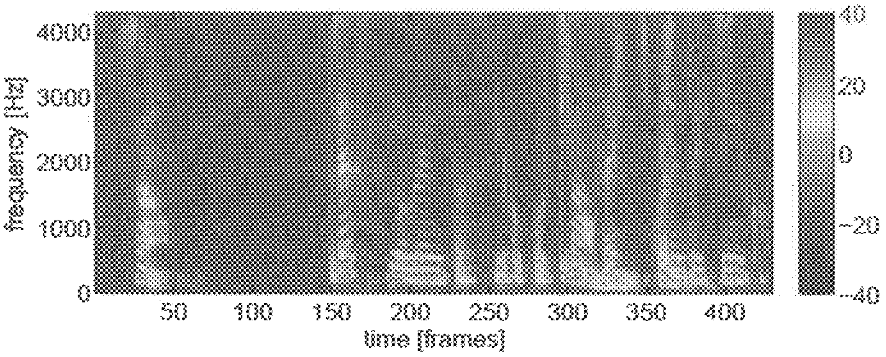
Figure 11D:
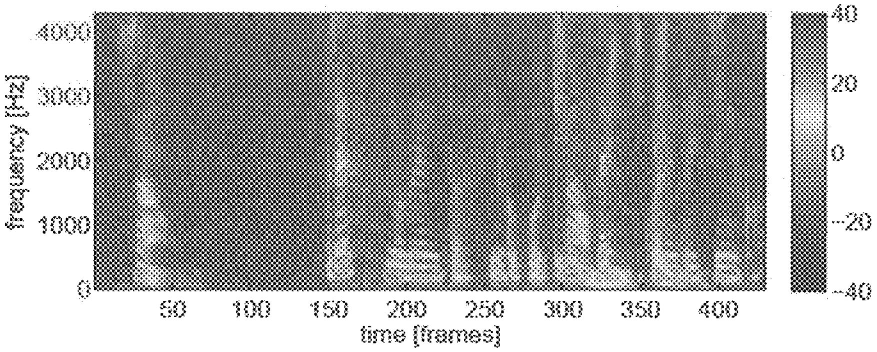

To illustrate the PDC filtering, FIGS. 11A-11D show two speech signals which have been mixed to obtain input signals with and without ICTD. In particular, FIGS. 11A-11D illustrate input source signals for illustrating the PDC, wherein FIG. 11A illustrates source signal 1; wherein FIG. 11B illustrates source signal 2; wherein FIG. 11C illustrates a left channel of a mixture signal; and wherein FIG. 11D illustrates a right channel of a mixture signal.

The two-channel mixture signal is generated by mixing the speech source signals with equal gains to each channel and by adding white noise with an SNR of 10 dB (K-weighted) to the signal.

Figure 12A:
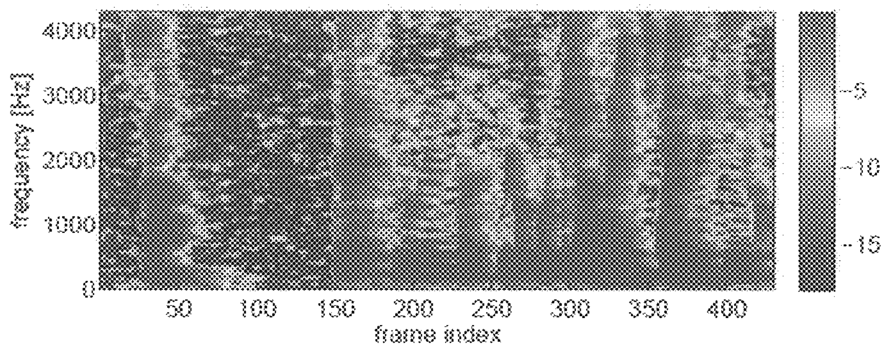
FIGS. 12A-12C illustrate the spectral weights computed from a gain function according to an embodiment.
Figure 12B:
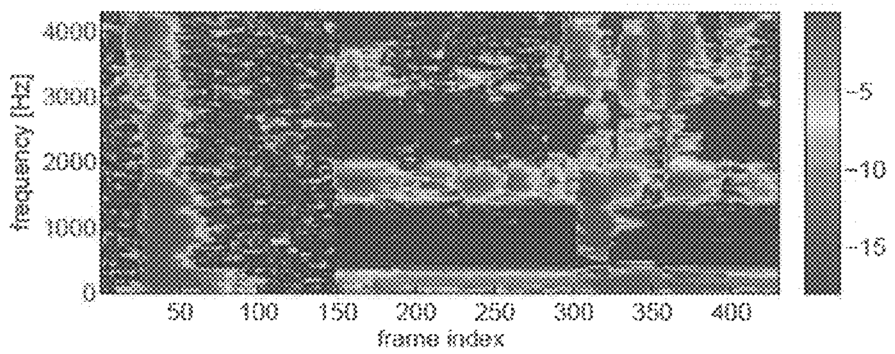
Figure 12C:
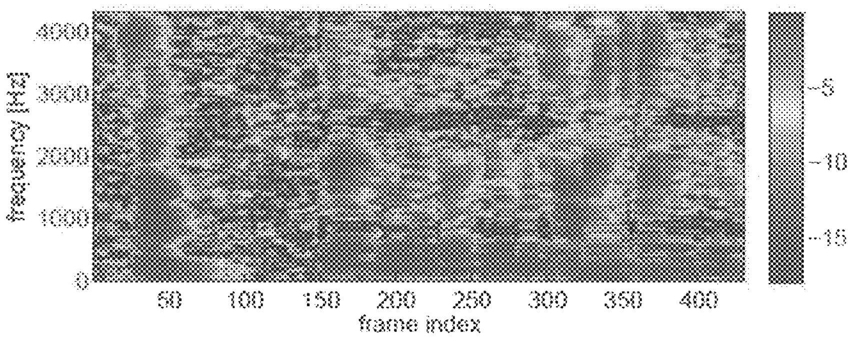

FIGS. 12A-12C show the spectral weights computed from gain function (13). In particular, FIGS. 12A-12C illustrate spectral weights $G_{c2}(m, k; 1, 3)$ for demonstrating the PDC filtering, wherein FIG. 12A illustrates spectral weights for input signals without ICTD, PDC disabled; FIG. 12B illustrates spectral weights for input signals with ICTD, PDC disabled; and FIG. 12C illustrates spectral weights for input signals with ICTD, PDC enabled.

The spectral weights in the upper plot are close to 0 dB when speech is active and assume the minimum value in time-frequency regions with low SNR. The second plot shows the spectral weights for an input signal where the first speech signal (FIG. 11A) is mixed with an ICTD of 26 samples. The comb-filter characteristics is illustrated in FIG. 12B. FIG. 12C shows the spectral weights when PDC is enabled. The comb-filtering artifacts are largely reduced, although the compensation is not perfect near the notch frequencies at 848 Hz and 2544 Hz.

Informal listening shows that the additive noise is largely attenuated. When processing signals without ICTD, the output signals have a bit of an ambient sound characteristic which results presumably from the phase incoherence introduced by the additive noise. When processing signals with ICTD, the first speech signal (FIG. 11A) is largely attenuated and strong comb-filtering artifacts are audible when not applying the PDC filtering. With additional PDC filtering, the comb-filtering artifacts are still slightly audible, but much less annoying. Informal listening to other material reveals light artifacts, which can be reduced either by decreasing $\gamma$, by increasing $\beta$, or by adding a scaled version of the unprocessed input signal to the output. In general, artifacts are less audible when attenuating the center signal and more audible when extracting the center signal. Distortions of the perceived spatial image are very small. This can be attributed to the fact that the spectral weights are identical for all channel signals and do not affect the ICLDs. The comb-filtering artifacts are hardly audible when processing natural recordings featuring time-of-arrival stereophony for whom a mono downmix is not subject to strong audible comb-filtering artifacts. For the PDC filtering, it can be noted that small values of the time constant of the recursive averaging (in particular the instantaneous compensation of phase differences when computing $X_d$) introduces coherence in the signals used for the downmix. Consequently, the processing is agnostic with respect to the diffuseness of the input signal. When the time constant is increased, it can be observed that (1) the effect of the PDC for input signals with amplitude difference stereophony decreases and (2) the comb-filtering effect becomes more audible at note onsets when the direct sound sources are not time-aligned between the input channels.

Concepts for scaling the center signal in audio recordings by applying real-valued spectral weights which are computed from monotonic functions of the SDR have been provided. The rationale is that center signal scaling needs to take into account both, the lateral displacement of direct sources and the amount of diffuseness, and that these characteristics are implicitly captured by the SDR. The processing can be controlled by semantically meaningful user parameters and is in comparison to other frequency domain techniques of low computational complexity and memory load. The proposed concepts give good results when processing input signals featuring amplitude difference stereophony, but can be subject to comb-filtering artifacts when the direct sound sources are not time-aligned between the input channels. A first approach to solve this is to compensate for non-zero phase in the inter-channel transfer function.

So far, the concepts of embodiments have been tested by means of informal listening. For typical commercial recordings, the results are of good sound quality but also depend on the desired separation strength.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In many embodiments, parts of the systems and apparatuses are provided in devices including microprocessors. Various embodiments of systems, apparatuses, and methods described herein may be implemented fully or partially in software and/or firmware. This software and/or firmware may take the form of instructions contained in or on a non-transitory computer-readable storage medium. Those instructions then may be read and executed by one or more processors to enable performance of the operations described herein. The instructions may be in any suitable form such as, but not limited to, source code, compiled code, interpreted code, executable code, static code, dynamic code, and the like. Such a computer-readable medium may include any tangible non-transitory medium for storing information in a form readable by one or more computers such as, but not limited to, read only memory (ROM); random access memory (RAM); magnetic disk storage media; optical storage media; a flash memory, etc.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is, therefore, intended that the following appended claims be interpreted as including all such alterations, permutations, and equivalents as fall within the true spirit and scope of the present invention.

The invention claimed is:

1. An apparatus for generating a modified audio signal comprising two or more modified audio channels from an audio input signal comprising two or more audio input channels, wherein the apparatus comprises:

an information generator for generating signal-to-downmix information, wherein the information generator is adapted to generate signal information by combining a spectral value of each of the two or more audio input channels in a first way, wherein the information generator is adapted to generate downmix information by combining the spectral value of each of the two or more audio input channels in a second way being different from the first way, and wherein the information generator is adapted to combine the signal information and the downmix information to acquire signal-to-downmix information, and a signal attenuator for attenuating the two or more audio input channels depending on the signal-to-downmix information to acquire the two or more modified audio channels, wherein the information generator is configured to generate the signal information $\Phi_1(m, k)$ according to the formula:

$$\Phi_1(m,k)=\epsilon\{WX(m,k)(WX(m,k))^H\},$$

wherein the information generator is configured to generate the downmix information $\Phi_2(m, k)$ according to the formula:

$$\Phi_2(m,k)=\epsilon\{VX(m,k)(VX(m,k))^H\}, \text{ and}$$

wherein the information generator is configured to generate a signal-to-downmix ratio as the signal-to-downmix information $R_g(m, k, \beta)$ according to the formula:

$$R_g(m,k,\beta)=\left(\frac{tr\{\Phi_1(m,k)^\beta\}}{tr\{\Phi_2(m,k)^\beta\}}\right)^{\frac{1}{2\beta-1}}$$

wherein X(m, k) indicates the audio input signal, wherein $$X(m,k)=[X_1(m,k)\ \ldots\ X_N(m,k)]^T,$$

wherein N indicates the number of audio input channels of the audio input signal, wherein m indicates a time index, and wherein k indicates a frequency index, wherein $X_1(m, k)$ indicates the first audio input channel, wherein $X_N(m, k)$ indicates the N-th audio input channel, wherein V indicates a matrix or a vector, wherein W indicates a matrix or a vector, wherein $^H$ indicates the conjugate transpose of a matrix or a vector, wherein $\epsilon\{\bullet\}$ is an expectation operation, wherein β is a real number with β>0, and wherein tr{ } is the trace of a matrix.

2. The apparatus according to claim 1, wherein V is a row vector of length N whose elements are equal to one and W is the identity matrix of size N×N.

3. The apparatus according to claim 1, wherein V=[1, 1], wherein W=[1, −1] and wherein N=2.

4. The apparatus according to claim 1, wherein the number of the modified audio channels is equal to the number of the audio input channels, or wherein the number of the modified audio channels is smaller than the number of the audio input channels.

5. The apparatus according to claim 1, wherein the information generator is configured to process the spectral value of each of the two or more audio input channels to acquire two or more processed values, and wherein the information generator is configured to combine the two or more processed values to acquire the signal information, and wherein the information generator is configured to combine the spectral value of each of the two or more audio input channels to acquire a combined value, and wherein the information generator is configured to process the combined value to acquire the downmix information.

6. The apparatus according to claim 5, wherein the information generator is configured to process the combined value by determining a power spectral density of the combined value.

7. The apparatus according to claim 6, wherein the information generator is configured to use $$s(m,k,\beta)=\Sigma_{i=1}^{N}\Phi_{i,i}(m,k)^\beta$$

to acquire the signal information, wherein $\Phi_{i,i}(m, k)$ indicates the auto power spectral density of the spectral value of the i-th audio signal channel.

8. The apparatus according to claim 7, wherein the information generator is configured to determine $$R(m,k,\beta)=\left(\frac{\sum_{i=1}^{N}\Phi_{i,i}(m,k)^\beta}{\Phi_d(m,k)^\beta}\right)^{\frac{1}{2\beta-1}}$$

to acquire the signal-to-downmix ratio, wherein $\Phi_d(m, k)$ indicates the power spectral density of the combined value.

9. The apparatus according to claim 1, wherein the information generator is configured to process the spectral value of each of the two or more audio input channels by multiplying said spectral value by the complex conjugate of said spectral value to acquire an auto power spectral density of said spectral value for each of the two or more audio input channels.

10. The apparatus according to claim 1, wherein the signal attenuator is adapted to attenuate the two or more audio input channels depending on a gain function G(m, k) according to the formula:

$$Y(m,k)=G(m,k)X(m,k),$$

wherein the gain function G(m, k) depends on the signal-to-downmix information, and wherein the gain function G(m, k) is a monotonically increasing function of the signal-to-downmix information or a monotonically decreasing function of the signal-to-downmix information, wherein X(m, k) indicates the audio input signal, wherein Y(m, k) indicates the modified audio signal, wherein m indicates a time index, and wherein k indicates a frequency index.

11. The apparatus according to claim 10, wherein the gain function G(m, k) is a first function $G_{c_1}(m, k, \beta, \gamma)$, a second function $G_{c_2}(m, k, \beta, \gamma)$, a third function $G_{s_1}(m, k, \beta, \gamma)$ or a fourth function $G_{s_2}(m, k, \beta, \gamma)$, wherein $$G_{c_1}(m,k,\beta,\gamma)=(1+R_{min}-R(m,k,\beta))^\gamma,$$

wherein $$G_{c_2}(m,k,\beta,\gamma)=\left(\frac{R_{min}}{R(m,k,\beta)}\right)^\gamma,$$

wherein $$G_{s_1}(m,k,\beta,\gamma)=R(m,k,\beta)^\gamma,$$

wherein $$G_{s_2}(m,k,\beta,\gamma) = \left(1 + R_{min} - \frac{R_{min}}{R(m,k,\beta)}\right)^{\gamma},$$

wherein β is a real number with β>0,
wherein γ is a real number with γ>0, and
wherein $R_{min}$ indicates the minimum of R.

12. A system comprising:

a phase compensator for generating a phase-compensated audio signal comprising two or more phase-compensated audio channels from an unprocessed audio signal comprising two or more unprocessed audio channels, and an apparatus according to claim 1 for receiving the phase compensated audio signal as an audio input signal and for generating a modified audio signal comprising two or more modified audio channels from the audio input signal comprising the two or more phase-compensated audio channels as two or more audio input channels, wherein one of the two or more unprocessed audio channels is a reference channel, wherein the phase compensator is adapted to estimate for each unprocessed audio channel of the two or more unprocessed audio channels which is not the reference channel a phase transfer function between said unprocessed audio channel and the reference channel, and wherein the phase compensator is adapted to generate the phase-compensated audio signal by modifying each unprocessed audio channel of the unprocessed audio channels which is not the reference channel depending on the phase transfer function of said unprocessed audio channel.

13. A method for generating a modified audio signal comprising two or more modified audio channels from an audio input signal comprising two or more audio input channels, wherein the method comprises:

generating signal information by combining a spectral value of each of the two or more audio input channels in a first way, generating downmix information by combining the spectral value of each of the two or more audio input channels in a second way being different from the first way, generating signal-to-downmix information by combining the signal information and the downmix information, and attenuating the two or more audio input channels depending on the signal-to-downmix information to acquire the two or more modified audio channels, wherein generating the signal information $\Phi_1(m, k)$ is conducted according to the formula:

$$\Phi_1(m,k)=\epsilon\{WX(m,k)(WX(m,k))^H\},$$

wherein generating the downmix information $\Phi_2(m, k)$ is conducted according to the formula:

$$\Phi_2(m,k)=\epsilon\{VX(m,k)(VX(m,k))^H\}, \text{ and}$$

wherein a signal-to-downmix ratio is generated as the signal-to-downmix information $R_g(m, k, \beta)$ according to the formula $$R_g(m,k,\beta) = \left(\frac{tr\{\Phi_1(m,k)^{\beta}\}}{tr\{\Phi_2(m,k)^{\beta}\}}\right)^{\frac{1}{2\beta-1}}$$

wherein X(m, k) indicates the audio input signal, wherein $$X(m,k)=[X_1(m,k) \ldots X_N(m,k)]^T,$$

wherein N indicates the number of audio input channels of the audio input signal, wherein m indicates a time index, and wherein k indicates a frequency index, wherein $X_1(m, k)$ indicates the first audio input channel, wherein $X_N(m, k)$ indicates the N-th audio input channel, wherein V indicates a matrix or a vector,
wherein W indicates a matrix or a vector,
wherein $^H$ indicates the conjugate transpose of a matrix or a vector,
wherein ε{•} is an expectation operation,
wherein β is a real number with β>0, and
wherein tr{ } is the trace of a matrix.

14. A non-transitory computer-readable storage device having instructions stored thereon which, when executed by the one or more processors, cause the one or more processors to perform operations comprising:

generating signal information by combining a spectral value of each of the two or more audio input channels in a first way, generating downmix information by combining the spectral value of each of the two or more audio input channels in a second way being different from the first way, generating signal-to-downmix information by combining the signal information and the downmix information, and attenuating the two or more audio input channels depending on the signal-to-downmix information to acquire the two or more modified audio channels, wherein generating the signal information $\Phi_1(m, k)$ is conducted according to the formula:

$$\Phi_1(m,k)=\epsilon\{WX(m,k)(WX(m,k))^H\},$$

wherein generating the downmix information $\Phi_2(m, k)$ is conducted according to the formula:

$$\Phi_2(m,k)=\epsilon\{VX(m,k)(VX(m,k))^H\}, \text{ and}$$

wherein a signal-to-downmix ratio is generated as the signal-to-downmix information $R_g(m, k, \beta)$ according to the formula $$R_g(m,k,\beta) = \left(\frac{tr\{\Phi_1(m,k)^{\beta}\}}{tr\{\Phi_2(m,k)^{\beta}\}}\right)^{\frac{1}{2\beta-1}}$$

wherein X(m, k) indicates the audio input signal, wherein $$X(m,k)=[X_1(m,k) \ldots X_N(m,k)]^T,$$

wherein N indicates the number of audio input channels of the audio input signal, wherein m indicates a time index, and wherein k indicates a frequency index, wherein $X_1(m, k)$ indicates the first audio input channel, wherein $X_N(m, k)$ indicates the N-th audio input channel, wherein V indicates a matrix or a vector,
wherein W indicates a matrix or a vector,
wherein $^H$ indicates the conjugate transpose of a matrix or a vector,
wherein ε{•} is an expectation operation,
wherein β is a real number with β>0, and
wherein tr{ } is the trace of a matrix.

* * * * *